(12) United States Patent
Hashimoto

(10) Patent No.: US 9,831,376 B2
(45) Date of Patent: Nov. 28, 2017

(54) POLYESTER FILM AND METHOD FOR PRODUCING THE SAME, BACK SHEET FOR SOLAR CELL, AND SOLAR CELL MODULE

(71) Applicant: FUJIFILM Corporation, Tokyo (JP)

(72) Inventor: Kiyokazu Hashimoto, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 326 days.

(21) Appl. No.: 14/495,258

(22) Filed: Sep. 24, 2014

(65) Prior Publication Data

US 2015/0007885 A1    Jan. 8, 2015

Related U.S. Application Data

(63) Continuation of application No. PCT/JP2013/056737, filed on Mar. 12, 2013.

(30) Foreign Application Priority Data

Mar. 26, 2012 (JP) ................................. 2012-070106
Jun. 22, 2012 (JP) ................................. 2012-141288

(51) Int. Cl.
*B32B 5/14* (2006.01)
*B32B 27/08* (2006.01)
(Continued)

(52) U.S. Cl.
CPC .............. *H01L 31/18* (2013.01); *C08J 7/042* (2013.01); *H01L 31/049* (2014.12); *B05D 3/002* (2013.01);
(Continued)

(58) Field of Classification Search
None
See application file for complete search history.

(56) References Cited

U.S. PATENT DOCUMENTS 5,914,188 A * 6/1999 Kobayashi ............... C08J 7/047
 428/331
6,099,757 A * 8/2000 Kulkarni .................. C09D 5/24
 252/500

(Continued)

FOREIGN PATENT DOCUMENTS

JP   2002-117735      4/2002
JP   2009-158952 A    7/2009

(Continued)

OTHER PUBLICATIONS

Official Action issued by the Japanese Patent Office (JPO) dated Mar. 10, 2015 in connection with Japanese Patent Application No. 2013-048718.

(Continued)

Primary Examiner — Vivian Chen
(74) Attorney, Agent, or Firm — Edwards Neils LLC; Jean C. Edwards, Esq.

(57) ABSTRACT

A polyester film containing a polyester support having a terminal carboxylic acid value of from 3 to 20 eq/ton and IV of from 0.65 to 0.9 dL/g, and a conductive layer having a surface specific resistance of from $10^6$ to $10^{14}\Omega$ per square with an in-plane distribution of from 0.1 to 20% exhibits an improvement in withstand voltage.

20 Claims, 1 Drawing Sheet

(51) Int. Cl.

| | | |
|---|---|---|
| B32B 27/36 | (2006.01) | |
| C08L 67/02 | (2006.01) | |
| C08L 67/03 | (2006.01) | |
| C09D 5/24 | (2006.01) | |
| C08K 5/29 | (2006.01) | |
| C08K 5/34 | (2006.01) | |
| C08K 5/3442 | (2006.01) | |
| H01L 31/049 | (2014.01) | |
| H01B 1/12 | (2006.01) | |
| H01B 1/20 | (2006.01) | |
| C08J 7/04 | (2006.01) | |
| H01L 31/18 | (2006.01) | |
| C08G 63/12 | (2006.01) | |
| C08G 63/16 | (2006.01) | |
| C08G 63/137 | (2006.01) | |
| C08G 63/199 | (2006.01) | |
| B05D 3/00 | (2006.01) | |
| B05D 5/12 | (2006.01) | |
| B05D 3/04 | (2006.01) | |
| B05D 3/02 | (2006.01) | |
| B05D 7/04 | (2006.01) | |

(52) U.S. Cl.
CPC .............. B05D 3/007 (2013.01); B05D 3/02 (2013.01); B05D 3/0254 (2013.01); B05D 3/04 (2013.01); B05D 3/0406 (2013.01); B05D 3/0426 (2013.01); B05D 5/12 (2013.01); B05D 7/04 (2013.01); B05D 2201/02 (2013.01); B32B 5/14 (2013.01); B32B 5/142 (2013.01); B32B 27/08 (2013.01); B32B 27/36 (2013.01); B32B 2255/10 (2013.01); B32B 2255/26 (2013.01); B32B 2307/202 (2013.01); B32B 2367/00 (2013.01); B32B 2457/12 (2013.01); C08G 63/12 (2013.01); C08G 63/137 (2013.01); C08G 63/16 (2013.01); C08G 63/199 (2013.01); C08J 7/04 (2013.01); C08J 2367/02 (2013.01); C08K 5/29 (2013.01); C08K 5/34 (2013.01); C08K 5/3442 (2013.01); C08L 67/02 (2013.01); C08L 67/03 (2013.01); C09D 5/24 (2013.01); H01B 1/12 (2013.01); H01B 1/20 (2013.01); Y02E 10/50 (2013.01); Y10T 428/31786 (2015.04)

(56) References Cited

U.S. PATENT DOCUMENTS

| | | | | |
|---|---|---|---|---|
| 6,458,467 B1* | 10/2002 | Mizuno | ................ | C09J 7/0246 428/141 |
| 8,637,764 B2* | 1/2014 | Nozawa | ............... | H01L 31/049 136/256 |
| 8,642,715 B2* | 2/2014 | Hashimoto | ............... | C08J 5/18 428/480 |
| 8,784,930 B2* | 7/2014 | Chiou | ................... | B82Y 30/00 427/256 |
| 2003/0008064 A1* | 1/2003 | Baumlin | ............. | B05D 3/0254 427/8 |
| 2005/0214526 A1* | 9/2005 | Klein | ..................... | B32B 27/36 428/328 |
| 2006/0257638 A1* | 11/2006 | Glatkowski | ............. | C09D 5/24 428/292.1 |
| 2006/0276617 A1* | 12/2006 | Yano | .................... | C08F 290/06 528/272 |
| 2008/0053512 A1* | 3/2008 | Kawashima | ...... | B32B 17/10018 136/244 |
| 2008/0161554 A1* | 7/2008 | Dai | ...................... | C08G 18/10 540/454 |
| 2008/0274352 A1* | 11/2008 | Hao | .......................... | C08J 7/04 428/339 |
| 2008/0284950 A1* | 11/2008 | Itoh | ......................... | C09D 5/24 349/96 |
| 2008/0311385 A1* | 12/2008 | Miyazaki | ................ | B32B 27/08 428/330 |
| 2009/0017249 A1* | 1/2009 | Suh | ........................ | C09J 7/0246 428/41.8 |
| 2009/0101488 A1* | 4/2009 | Jiang | ...................... | G06F 3/044 200/512 |
| 2009/0275678 A1* | 11/2009 | Kumazawa | ............. | C08L 67/00 523/523 |
| 2010/0188196 A1* | 7/2010 | Van De Belt | ........ | C09D 11/101 340/10.1 |
| 2010/0215902 A1* | 8/2010 | Kiehne | ............ | B32B 17/10018 428/141 |
| 2010/0239868 A1* | 9/2010 | Takada | .................... | B32B 27/08 428/423.1 |
| 2011/0183110 A1* | 7/2011 | Yamazaki | ................ | G02B 1/04 428/141 |
| 2011/0223419 A1* | 9/2011 | Okawara | ................ | B32B 27/36 428/355 EN |
| 2011/0224385 A1* | 9/2011 | Shoji | .................... | C07D 273/08 525/437 |
| 2011/0237755 A1* | 9/2011 | Shoji | .................... | C07D 245/02 525/420 |
| 2011/0251384 A1* | 10/2011 | Shoji | .................... | C07D 498/10 540/466 |
| 2011/0268935 A1* | 11/2011 | Suzuki | ................... | G02B 1/105 428/201 |
| 2011/0305913 A1* | 12/2011 | Hinton | ................. | B29C 55/065 428/480 |
| 2012/0003467 A1* | 1/2012 | Suzuki | .................... | B32B 33/00 428/336 |
| 2012/0080218 A1* | 4/2012 | Chiou | .................... | B82Y 30/00 174/257 |
| 2012/0167976 A1 | 7/2012 | Aoyama et al. | | |
| 2012/0178897 A1* | 7/2012 | Nozawa | ................ | H01L 31/049 528/308.1 |
| 2012/0192944 A1* | 8/2012 | Aoyama | ............... | H01L 31/048 136/256 |
| 2012/0302676 A1 | 11/2012 | Oya et al. | | |
| 2013/0012665 A1* | 1/2013 | Nozawa | ................ | C08G 63/85 525/437 |
| 2015/0007885 A1* | 1/2015 | Hashimoto | ........... | H01L 31/049 136/256 |

FOREIGN PATENT DOCUMENTS

| | | | |
|---|---|---|---|
| JP | 2010-106096 | * | 5/2010 |
| JP | 2010-235824 A | | 10/2010 |
| JP | 2011-153209 A | | 8/2011 |
| WO | WO 2010/071211 | * | 6/2010 |
| WO | WO 2010/071212 | * | 6/2010 |
| WO | WO 2010/071213 | * | 6/2010 |
| WO | WO 2010-137099 | | 12/2010 |
| WO | WO 2011/030745 | * | 3/2011 |
| WO | WO 2011/030896 | * | 3/2011 |
| WO | WO 2011/087043 | * | 7/2011 |

OTHER PUBLICATIONS

Official Action issued by the Japanese Patent Office (JPO) dated Sep. 8, 2015 in connection with Japanese Patent Application No. 2013-048718.
International Search Report issued in PCT/JP2013/056737 dated May 14, 2013.
Written Opinion issued in PCT/JP2013/056737 dated May 14, 2013.
International Preliminary Report on Patentability, issued by WIPO dated Oct. 9, 2014, in related PCT Application No. PCT/JP/2013/056737, w/ English translation.

* cited by examiner

POLYESTER FILM AND METHOD FOR PRODUCING THE SAME, BACK SHEET FOR SOLAR CELL, AND SOLAR CELL MODULE

CROSS-REFERENCE TO RELATED APPLICATIONS

This application is a continuation application of International Application No. PCT/JP2013/056737, filed on Mar. 12, 2013, which was published under PCT article 21(2) in Japanese, which in turn claims the benefit of priority from Japanese Application No. 2012-070106, filed Mar. 26, 2012, and Japanese Application No. 2012-141288, filed Jun. 22, 2012, the disclosures of which Applications are incorporated by reference herein in their entirety.

BACKGROUND OF THE INVENTION

Field of the Invention

The present invention relates to a polyester film and a method for producing the same, a back sheet for a solar cell, and a solar cell module.

Background Art

A solar cell module generally has such a structure that contains glass or a front sheet on a light receiving surface, on which the solar light is incident, having laminated thereon in this order a transparent filling material (which may be hereinafter referred to as a sealant), a solar cell device, a sealant and a back sheet. Specifically, a solar cell device is generally embedded with a resin (sealant), such as EVA (ethylene-vinyl acetate copolymer), and a protective sheet for a solar cell is further adhered thereon. It has been known that a polyester film, particularly a polyethylene terephthalate (which may be hereinafter referred to as PET) film is used as the back sheet for a solar cell.

However, the protective sheet for a solar cell, particularly a back sheet for a solar cell used as the outermost layer, is assumed to be exposed outdoor weather for a prolonged period of time, and thus is demanded to have excellent weather resistance.

A polyester film, such as PET, used as a back sheet for a solar cell is excellent in heat resistance, mechanical characteristics, chemical resistance and the like, and thus is frequently used industrially, but still has room for improvement in hydrolysis resistance. It has been known that a polyester film may be deteriorated by hydrolysis with the lapse of a prolonged period of time.

It has been known that the hydrolysis is accelerated by the catalytic action of the terminal carboxylic acid in the polyester, and as a technique for improving the hydrolysis resistance of a polyester film as a measure thereto, it has been known to use a terminal blocking agent, such as a polycarbodiimide, capable of reacting with the terminal carboxylic acid (see, for example, Patent Literature 1). Patent Literature 1 describes that a polyester film using a terminal blocking agent, such as a polycarbodiimide, is controlled to have particular characteristics, thereby providing an electric insulating film that has excellent hydrolysis resistance and excellent durability.

Patent Literature 2 describes that a conductive layer and a readily adhesive layer are provided on a polyester film, such as PET, used as a back sheet for a solar cell, thereby imparting a high partial discharge voltage.

CITATION LIST

Patent Literatures

Patent Literature 1: JP-A-2010-235824
Patent Literature 2: JP-A-2009-158952

SUMMARY OF INVENTION

However, it has been found that the back sheet described in Patent Literature 1 is still demanded to be improved in partial discharge voltage. As a result of a trace experiment by the present inventors for the back sheet for a solar cell described in Patent Literature 2, it has been found that there is room for improvement in withstand voltage although there is a conductive layer provided.

An object of the invention is to solve the aforementioned problems. A problem to be solved by the invention is to provide a polyester film having a high improvement rate in withstand voltage.

As a result of earnest investigations made by the inventors for solving the problem, it has been found that a polyester film having a high improvement rate in withstand voltage may be obtained by providing a conductive layer having a surface specific resistance with an in-plane distribution on a polyester support having particular characteristics.

The invention as specific measures for solving the problem is as follows.

[1] A polyester film containing a polyester support that has a terminal carboxylic acid value (AV) of from 3 to 20 eq/ton and IV of from 0.65 to 0.9 dL/g, and a conductive layer that is provided at least one surface of the polyester support, the conductive layer having a surface specific resistance R0 of from $10^6$ to $10^{14} \Omega$ per square, the surface specific resistance R0 of the conductive layer having an in-plane distribution of from 0.1 to 20%.

[2] The polyester film according to the item [1], wherein the polyester support preferably contains at least one layer of a polyester layer that contains as a major component a polyester component that satisfies at least one of the following conditions (A) and (B):

condition (A): the polyester component is a polyester composition that contains a polyester and a terminal blocking agent in an amount of from 0.1 to 10% by mass based on the polyester, and condition (B): the polyester component is a CHDM polyester that contains a structure derived from 1,4-cyclohexanedimethanol (CHDM) in an amount of from 0.1 to 20% by mol or from 80 to 100% by mol based on a diol component.

[3] The polyester film according to the item [2], which preferably has, as the outermost layer of the polyester support on the side where the conductive layer is provided, a polyester layer that contains as a major component a polyester component that satisfies at least one of the conditions (A) and (B).

[4] The polyester film according to the item [2] or [3], wherein the polyester component preferably satisfies the condition (A).

[5] The polyester film according to the item [4], wherein the terminal blocking agent preferably has a molecular weight of from 200 to 100,000.

[6] The polyester film according to the item [4] or [5], wherein the terminal blocking agent is preferably a carbodiimide compound.

[7] The polyester film according to any one of the items [4] to [6], wherein the terminal blocking agent is preferably a carbodiimide compound having a carbodiimide group, and having a cyclic structure in which two nitrogen atoms in the carbodiimide group (a first nitrogen atom and a second nitrogen atom) are bonded via a linking group.

[8] The polyester film according to any one of the items [1] to [7], wherein the conductive layer preferably has a thickness distribution of from 0.1 to 10%.

[9] The polyester film according to any one of the items [1] to [8], wherein the conductive layer preferably contains an organic conductive agent.

[10] The polyester film according to any one of the items [1] to [9], wherein the conductive layer preferably has a thickness of from 0.01 to 50 μm.

[11] The polyester film according to any one of the items [1] to [10], which preferably comprises a readily adhesive layer having a thickness unevenness of from 0.1 to 10% on at least one surface of the polyester support.

[12] The polyester film according to any one of the items [1] to [11], wherein the polyester support is preferably formed by extruding a molten material of a composition containing a polyester and a terminal blocking agent from a die, and then solidifying the composition by cooling with air blow having an air blow amount with a modulation of from 0.1 to 10%.

[13] The polyester film according to any one of the items [1] to [12], wherein the conductive layer is preferably formed by coating a coating liquid for a conductive layer, and then drying the coating liquid at an outlet port of a drying zone by applying a temperature distribution of from 0.1 to 10° C.

[14] The polyester film according to any one of the items [1] to [13], wherein the terminal blocking agent is preferably a cyclic carbodiimide compound.

[15] The polyester film according to any one of the items [1] to [14], which is preferably wound up into a roll form.

[16] A method for producing a polyester film containing: extruding a molten material of a polyester composition from a die and solidifying the composition by cooling, so as to produce a polyester support that has a terminal carboxylic acid value (AV) of from 3 to 20 eq/ton and IV of from 0.65 to 0.9 dL/g; and forming a conductive layer on at least one surface of the polyester support, the polyester support being cooled with air blow having an air blow amount with a modulation of from 0.1 to 10%.

[17] The method for producing a polyester film according to the item [16], wherein the polyester composition is preferably a composition that contains as a major component a polyester component that satisfies at least one of the following conditions (A) and (B):

condition (A): the polyester component is a polyester composition that contains a polyester and a terminal blocking agent in an amount of from 0.1 to 10% by mass based on the polyester, and condition (B): the polyester component is a CHDM polyester that contains a structure derived from 1,4-cyclohexanedimethanol (CHDM) in an amount of from 0.1 to 20% by mol or from 80 to 100% by mol of a diol component.

[18] The method for producing a polyester film according to the item [16] or [17], wherein the polyester component preferably satisfies the condition (A).

[19] The method for producing a polyester film according to any one of the items [16] to [18], which preferably contains: coating a coating liquid for a conductive layer on at least one surface of the polyester support; and conveying the polyester support having the coating liquid for a conductive layer coated thereon, in a drying zone, so as to form the conductive layer, and a temperature distribution of from 0.1 to 10° C. is preferably applied at an outlet port of the drying zone.

[20] A back sheet for a solar cell module, containing the polyester film according to any one of the items [1] to [15].

[21] A solar cell module containing the back sheet for a solar cell module according to the item [20].

The polyester film of the invention has a high improvement rate in withstand voltage. According to the method for producing a polyester film of the invention, the polyester film of the invention may be produced.

DESCRIPTION OF EMBODIMENTS

Figure 1:
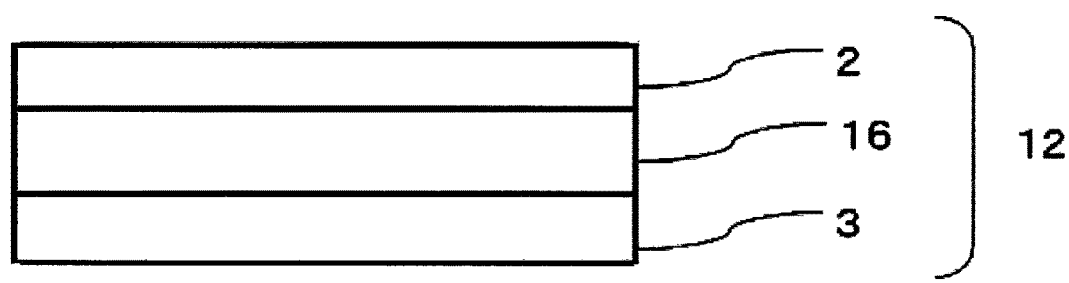
FIG. 1 is a schematic view showing an example of a cross section of a polyester film according to the invention.

The polyester film and the method for producing the same, and the back sheet for a solar cell module and a solar cell module using the same according to the invention will be described in detail below.

The description for the constitutional components shown below may be made with reference to representative embodiments of the invention, but the invention is not limited to the embodiments. In the description, a numerical range expressed by "from X to Y" means a range including the numerals X and Y as the lower limit and the upper limit, respectively.

Polyester Film

The polyester film of the invention contains a polyester support that has a terminal carboxylic acid value (AV) of from 3 to 20 eq/ton and IV of from 0.65 to 0.9 dL/g, and a conductive layer that is provided at least one surface of the polyester support, the conductive layer has a surface specific resistance R0 of from $10^6$ to $10^{14}\Omega$ per square, and the surface specific resistance R0 of the conductive layer has an in-plane distribution of from 0.1 to 20%.

According to the constitution, the polyester film of the invention may have a high improvement rate in withstand voltage and may have a readily adhesive layer that has good adhesion property to a sealant of a solar cell module. While not sticking to any theory, a conductive layer (which may be referred to as an antistatic layer in some cases) may be reduced in surface specific resistance by forming a conductive agent (which may be referred to as an antistatic agent in some cases) non-uniformly on the surface of the conductive layer. In general, a portion having the conductive agent in a low concentration on the surface of the conductive layer is liable to cause such a portion that the conductive agent is not in contact with an arbitrary substance outside the conductive layer, which may increase the resistance, and thus the surface specific resistance is difficult to be reduced with a uniformly low concentration thereof. In the case where the conductive agent on the surface of the conductive layer has unevenness in concentration, i.e., the surface of the conductive layer has a portion having the conductive agent in a high concentration, on the other hand, the conductive agent is concentrated in the portion to facilitate the conduction function. Accordingly, the resistance of the entire film surface may be reduced by forming locally a portion having a large surface specific resistance and a portion having a small surface specific resistance, as compared to the case of providing a uniform conductive layer with the same amount of the conductive agent. The polyester film of the invention has been completed as a result of such a finding that non-uniform coating of a conductive agent is advantageous for the same amount of the conductive agent, and when a conductive agent is distributed non-uniformly on a surface of a conductive layer, a portion having the conductive agent in a high concentration may be provide to facilitate electric conduction, thereby reducing the surface specific resistance of the conductive layer efficiently.

In the polyester film of the invention, the polyester support preferably contains at least one layer of a polyester layer that contains as a major component a polyester component that satisfies at least one of the following conditions (A) and (B):

condition (A): the polyester component is a polyester composition that contains a polyester and a terminal blocking agent in an amount of from 0.1 to 10% by mass based on the polyester, and condition (B): the polyester component is a CHDM polyester that contains a structure derived from 1,4-cyclohexanedimethanol (CHDM) in an amount of from 0.1 to 20% by mol or from 80 to 100% by mol based on a diol component.

The terminal blocking agent may be added to the polyester support to satisfy the condition (A), and thereby the conductive agent (which may be referred to as an antistatic agent in some cases) may be formed non-uniformly on the surface of the conductive layer (which may be referred to as an antistatic layer in some cases), which may facilitate reduction of the surface specific resistance of the conductive layer.

The reason why the advantageous effects of the invention may be obtained in the case of using the polyester component that satisfies the condition (B) will be described later.

A preferred structure of the polyester film of the invention is shown in FIG. 1. The polyester film 12 shown in FIG. 1 contains a polyester support 16 having provided one surface thereof a conductive layer 3. A readily adhesive layer 2 is preferably provided on the surface of the polyester support 16 that is opposite to the surface having the conductive layer 3 provided thereon, and in this case, as shown in FIG. 1, the conductive layer 3 and the readily adhesive layer 2 are preferably provided on the opposite sides of the polyester support 16, respectively. The conductive layer 3 is preferably in contact with the one surface of the polyester support 16.

Preferred embodiments of the layers of the polyester film of the invention will be described in detail below.

Polyester Support

The polyester film of the invention has a polyester support that has a terminal carboxylic acid value (AV) of from 3 to 20 eq/ton and IV of from 0.65 to 0.9 dL/g.

Thickness of Polyester Support

In the polyester film of the invention, the thickness of the polyester support is preferably from 30 to 350 μm.

In the invention, the thickness of the polyester support is more preferably from 40 to 300 μm, and further preferably from 50 to 250 μm, from the standpoint that the hygrothermal durability of the adhesion property may be further enhanced.

In recent years, a back sheet for a solar cell module is demanded to be improved in electric insulation property associated with the increase of the output power of the solar cell. In general, the electric insulation property is proportional to the thickness of the back sheet for a solar cell module, and thus a thicker back sheet is being demanded. In view of the demand, the thickness of the polyester film having the constitution of the invention may be set to the aforementioned preferred range, and thereby a back sheet for a solar cell module having good electric insulating property may be provided without increasing the thickness of the polyester support excessively.

Polyester

In the polyester film of the invention, the polyester layer preferably contains as a major component a polyester component that satisfies at least one of the conditions (A) and (B). The major component in the polyester layer herein means a polyester that is contained in the polyester layer in an amount of 80% by mol or more.

The polyester may be provided by synthesis and polymerization and may be a commercially available product.

The polyester may be produced by a known production method of a polyester. Specifically, the polyester may be produced in such a manner that a dialkyl ester used as an acid component is subjected to ester exchange reaction with a diol component, and then the reaction product is heated under reduced pressure to perform polycondensation thereof while removing the excessive diol component. The polyester may also be produced by a known direct polymerization method by using a dicarboxylic acid an acid component. Examples of the reaction catalyst used include known catalysts including a titanium compound, a lithium compound, a calcium compound, a magnesium compound, an antimony compound and a germanium compound.

The polyester used as the polymer support (i.e., the polyester support) in the invention may be a linear saturated polyester that is synthesized from an aromatic dibasic acid or an ester-forming derivative thereof and a diol or an ester-forming derivative thereof. Specific examples of the polyester include films or sheets of polyethylene terephthalate, polyethylene isophthalate, polybutylene terephthalate, poly(1,4-cyclohexylene dimethylene terephthalate) and polyethylene 2,6-naphthalate. Among these, polyethylene terephthalate, polyethylene 2,6-naphthalate and poly(1,4-cyclohexylene dimethylene terephthalate) are particularly preferred in view of the balance of the mechanical properties and the cost.

The poly(1,4-cyclohexylene dimethylene terephthalate) (which may be referred to as PCT herein) is preferably formed from terephthalic acid (TPA) as a dicarboxylic acid, and 1,4-cyclohexanedimethanol (which may be referred to as CHDM herein) and ethylene glycol (EG) as a major component of a diol. The major component herein means a component that is contained in 80% by mol or more.

The CHDM polyester herein means a polyester that contains a structure derived from 1,4-cyclohexanedimethanol (which may be referred to as CHDM herein) as a diol component.

The CHDM polyester preferably contains a structure derived from 1,4-cyclohexanedimethanol (CHDM) in an amount of from 0.1 to 20% by mol or from 80 to 100% by mol in the diol component (based on the total diol component) (i.e., the condition (B) is satisfied), more preferably from 0.5 to 16% by mol or from 83 to 98% by mol, and particularly preferably from 1 to 12% by mol or from 86 to 96% by mol.

In the case where the CHDM is contained to satisfy the condition (B), minute stretching unevenness is liable to occur on stretching, and thus the advantageous effects of the invention may be exhibited although a terminal blocking agent is not contained in the polyester support to satisfy the condition (A). This is because a CHDM group has a rigid structure with respect to an EG group and thus is difficult to be stretched to cause unevenness in stretching. Accordingly, in the case where the PCT is stretched after coating a conductive layer, the conductive layer may suffer unevenness in coating, thereby achieving the enhancement of the withstand voltage, which is an advantageous effect of the invention. The unevenness in stretching may occur conspicuously on forming crystalline structures by stretching. Specifically, unevenness in orientation may be formed associated with the unevenness in stretching, and a portion that is highly oriented may be crystallized to form a crystalline portion and a non-crystalline portion. The non-uniformity of crystals and non-crystals (in-plane distribution) may further cause the unevenness in stretching, i.e., the unevenness of the conductive layer.

For forming the crystals, the two ranges, i.e., the range where the proportion of the structure derived from CHDM is small (from 0.1 to 20% by mol) and the range where the proportion thereof is large (from 80 to 100% by mol), are preferred. This is because in the range between the aforementioned ranges, both CHDM and EG are present as a mixture to prevent the crystal from being formed.

The CHDM polyester may contain a diol component other than CHDM and EG, and representative examples thereof include an aliphatic diol, such as 1,2-propanediol, 1,3-propanediol, 1,4-butanediol, 1,2-butanediol and 1,3-butanediol, an alicyclic diol, such as spiroglycol and isosorbide, and an aromatic diol, such as bisphenol A, 1,3-benzenedimethanol, 1,4-benzenedimethanol and 9,9'-bis(4-hydroxyphenyl) fluorene, but the diol is not limited thereto.

Representative examples of a dicarboxylic acid other than TPA include an aliphatic dicarboxylic acid, such as malonic acid, succinic acid, glutaric acid, adipic acid, suberic acid, sebacic acid, dodecanedioic acid, dimer acid, eicosanedioic acid, pimelic acid, azelaic acid, methylmalonic acid and ethylmalonic acid, an alicyclic dicarboxylic acid, such as adamantanedicarboxylic acid, norbornenedicarboxylic acid, isosorbide, cyclohexanedicarboxylic acid and decalindicarboxylic acid, a dicarboxylic acid, such as isophthalic acid, phthalic acid, 1,4-naphthalenedicarboxylic acid, 1,5-naphthalenedicarboxylic acid, 2,6-naphthalenedicarboxylic acid, 1,8-naphthalenedicarboxylic acid, 4,4'-diphenyldicarboxylic acid, 4,4'-diphenyl ether dicarboxylic acid, 5-sodium sulfoisophthalate, phenylindanedicarboxylic acid, anthracenedicarboxylic acid, phenanthrenedicarboxylic acid and 9,9'-bis(4-carboxyphenyl)fluorensic acid, and ester derivatives thereof, but the dicarboxylic acid is not limited thereto. Among these, isophthalic acid (IPA) is preferred. The amount of IPA is preferably from 0 to 15% by mol, more preferably from 0 to 12% by mol, and further preferably from 0 to 9% by mol, based on the total amount of the dicarboxylic acid.

In the case where a CHDM polyester that satisfies the condition (B) is used, at least one layer containing the CHDM polyester that satisfies the condition (B) may be provided, and a single layer structure and a structure containing two or more layers may be used. Specifically, an additional layer other than the layer containing the CHDM polyester that satisfies the condition (B) may be laminated.

In the polyester film of the invention, the outermost layer of the polyester support on the side where the conductive layer is provided is preferably the polyester layer that contains as a major component the polyester component that satisfies at least one of the conditions (A) and (B), from the standpoint of facilitating the formation of unevenness in the conductive layer. Therefore, the polyester layer containing as a major component the CHDM polyester that satisfies the condition (B) is also preferably provided as the outermost layer of the polyester support on the side where the conductive layer is provided.

In the case where the amount of the structure derived from CHDM is from 80 to 100% by mol, in particular, the laminated structure is preferred. This is because when the proportion of the structure derived from CHDM is increased, the proportion of the rigid CHDM group is increased to induce breakage on stretching. Accordingly, a polyester that does not have the CHDM structure and thus is liable to be stretched (i.e., is difficult to be broken) is preferably laminated, and more preferably PET is laminated.

In the polyester film of the invention, such an embodiment is also preferred that contains a layer containing a CHDM polyester that satisfies the condition (B) (which may be referred to as a P1 layer) and a layer containing as a major component polyethylene terephthalate (which may be referred to as a P2 layer) laminated on each other.

The P2 layer herein means a layer containing a terephthalic acid unit in an amount of 95% or more in the dicarboxylic acid unit and an ethylene glycol unit in an amount of 95% by mol or more in the diol unit.

The P2 layer preferably has IV of from 0.7 to 0.9, more preferably from 0.72 to 0.85, and further preferably from 0.74 to 0.82. When the P2 layer has high IV, entanglement of the molecules is facilitated to enhance the stretchability, thereby suppressing the breakage.

In the polyester film of the invention, the total number of the P1 layer and the P2 layer is 2 or more, more preferably from 2 to 5, and further preferably from 2 to 4. In particular, such a structure is preferred that the P1 layer is provided as the outermost layer of the polyester support on the side where the conductive layer is provided, and examples thereof include a three-layer structure containing the P1 layer having both sides thereof the P2 layers, and a two-layer structure containing the P2 layer and the P1 layer laminated on each other.

In the case where the polyester film contains two or more layers, the total thickness of the P1 layer is preferably from 10 to 50%, more preferably from 15 to 45%, and further preferably from 20 to 40%, of the total thickness. When the thickness is the lower limit or more, the stretchability may be enhanced by the presence of PET, and when the thickness is the upper limit or less, the non-uniformity of the conductive layer due to the CHDM structure may be induced.

The laminated structure may be produced by an ordinary method, and may be achieved by laminating and extruding the melts (i.e., the molten materials of the resins) fed from plural extruder through a multiple manifold die or a feed block die.

The thickness of the layers of the polyester film may be obtained by measuring the cross section of the film with SIMS, and imaging the characteristic fragment of the P1 layer and the characteristic fragment of the P2 layer.

In the invention, polyethylene naphthalate (PEN) may also be preferably used. PEN has a small number of ester bonds per unit volume due to a large naphthalene ring, and thus exhibits high weather resistance due to high hydrolysis resistance, and simultaneously PEN has such an effect that the mutual action among PEN molecules is weak due to the low polarity caused by the small number of ester groups, which facilitates unevenness in stretching through formation of voids, and thus the formation of unevenness of the conductive layer is facilitated.

The polyester may be a homopolymer or a copolymer. The polyester may contain a small amount of a resin other than the polyester, such as a polyimide.

In the invention, the terminal carboxyl group content AV of the polyester is from 3 to 20 eq/ton, preferably from 4 to 17 eq/ton, and further preferably from 5 to 15 eq/ton. When the content exceeds the range, the terminal blocking agent may not be sufficiently reacted with the carboxylic acid to increase the polarity on the surface of the film, and thereby the non-uniformity of the conductive layer may be difficult to be formed. When the content is lower than the range, on the other hand, the amount of the carboxylic acid is too small to cause excessive unevenness in coating, which may cause a discontinuous phase, and thus the surface specific resistance may be excessively reduced.

The carboxyl group content in the polyester may be controlled by the polymerization catalyst species and the solid phase polymerization conditions after the normal polymerization before forming into the film, the film forming condition (such as the film forming temperature and time, the stretching conditions and thermal relaxation conditions), and the like. In particular, it is preferably controlled by the solid phase polymerization conditions before forming into the polymer support in the film form.

The carboxyl group content (AV) may be measured according to the method described in H. A. Phol, Anal. Chem., 26 (1954), 2145. Specifically, the target polyester is pulverized and dried with a vacuum dryer at 60° C. for 30 minutes. The polyester immediately after drying is weighed for 0.1000 g, to which 5 mL of benzyl alcohol is added, and then dissolved therein by heating to 205° C. for 2 minutes under stirring. After cooling the solution, 15 mL of chloroform is added to the solution, which is then titrated with an alkali standard solution (a 0.01 N KOH-benzyl alcohol mixed solution) to the neutralization point (pH=7.3±0.10) by using Phenol Red as an indicator, and the carboxyl group content is calculated from the titer.

In the protective sheet for a solar cell of the invention, the polyester preferably has an intrinsic viscosity IV (molecular weight) of 0.65 dL/g or more. Increasing the molecular weight of PET may be effective for decreasing the compatibility with the terminal blocking agent, and thereby the compatibility is lowered to localize the terminal blocking agent on the surface, which may impart the in-plane distribution of the surface specific resistance described later to the conductive layer. The upper limit of the intrinsic viscosity IV of the polyester is 0.9 dL/g or less. When the intrinsic viscosity IV exceeds the limit, AV may be increased during extrusion to increase the polarity on the surface, which may disadvantageously prevent formation of the distribution of the surface specific resistance. The intrinsic viscosity IV of the polyester is preferably 0.7 to 0.85 dL/g, and more preferably from 0.72 to 0.82 dL/g.

The IV value may be measured in such a manner that after pulverizing the target polyester, the polyester is dissolved in a mixed solvent of 1,2,2-tetrachloroethane and phenol (2/3 in mass ratio) to a concentration of 0.01 g/mL, and measured for the IV value with an Ubbelohde viscometer (AVL-6C, produced by Asahi Kasei Technosystem Co., Ltd.) at a temperature of 25° C. The specimen is dissolved at 120° C. for from 15 to 30 minutes.

The polyester is preferably subjected to solid phase polymerization after polymerization. According to the procedure, the preferred carboxyl group content and the preferred intrinsic viscosity may be easily achieved. The solid phase polymerization may be performed by a continuous process (in which the resin filled in a tower is slowly retained for a prescribed period of time while heating, and then discharged therefrom) or a batch process (in which the resin is placed in a vessel and heated for a prescribed period of time). Specifically, for the solid phase polymerization, such methods may be applied as those described, for example, in Japanese Patent No. 2,621,563, Japanese Patent No. 3,121,876, Japanese Patent No. 3,136,774, Japanese Patent No. 3,603,585, Japanese Patent No. 3,616,522, Japanese Patent No. 3,617,340, Japanese Patent No. 3,680,523, Japanese Patent No. 3,717,392 and Japanese Patent No. 4,167,159.

The VI of the polyester is increased, and the AV thereof is decreased, by increasing the time of the solid phase polymerization. The AV thereof is increased by increasing the temperature of the solid phase polymerization. The preferred conditions for the solid phase polymerization are a temperature of from 180 to 230° C. more preferably from 195 to 210° C., and further preferably from 195 to 210° C., and a solid phase polymerization time of from 10 to 70 hours, more preferably from 14 to 50 hours, and further preferably from 16 to 35 hours. The solid phase polymerization is preferably performed in vacuum or in an inert gas stream.

Terminal Blocking Agent

While the polyester film of the invention may contain or may not contain a terminal blocking agent, in the case where the polyester component does not satisfy the condition (B), the polyester support preferably contains a terminal blocking agent in an amount of from 0.1 to 11% by mass based on the polyester for satisfying the condition (A). The terminal blocking agent mixed in the polyester support may impart a non-uniform in-plane distribution of the surface specific resistance to the conductive layer described later. While not sticking to any theory, the terminal blocking agent is reacted with the terminal carboxylic acid of the polyester, thereby extinguishing the carboxylic acid as a polar group and reducing the polarity of the polyester support. The conductive agent contained in the conductive layer described later has a high polarity, and is difficult to be uniformly dispersed on the surface of the polyester support having a reduced polarity (this phenomenon may occur in both the coating and the co-extrusion). Accordingly, the terminal blocking agent that is concentrated on the surface of the polyester support, which is in contact with the conductive agent, may be effective on imparting the non-uniform in-plane distribution of the surface specific resistance to the conductive layer.

The terminal blocking agent has low compatibility with a polyester (particularly PET), and is liable to be present in the space (free volume) among the polyester molecules. Accordingly, the terminal blocking agent may be extracted from the interior of the polyester and concentrated in the vicinity of the surface of the polyester support. This effect may be exhibited more conspicuously by increasing the molecular weight of the terminal blocking agent to reduce the compatibility thereof with the polyester.

Examples of the terminal blocking agent include a carbodiimide compound, an oxazoline compound, an epoxy compound and a carbonate compound. The terminal blocking agent may exhibit the effect notably when it is added on forming a film along with the polyester resin. The terminal blocking agent used is preferably a carbodiimide compound. The solid phase polymerization and the terminal blocking agent may be used simultaneously.

Carbodiimide Terminal Blocking Agent

A carbodiimide compound having a carbodiimide group includes a monofunctional carbodiimide compound and a polyfunctional carbodiimide compound, and examples of the monofunctional carbodiimide compound include dicyclohexylcarbodiimide, diisopropylcarbodiimide, dimethylcarbodiimide, diisobutylcarbodiimide, dioctylcarbodiimide, t-butylisopropylcarbodiimide, diphenylcarbodiimide, di-t-butylcarbodiimide and di-β-naphthylcarbodiimide. Particularly preferred examples thereof include dicyclohexylcarbodiimide and diisopropylcarbodiimide.

The polyfunctional carbodiimide used is preferably a carbodiimide having a polymerization degree of from 3 to 15. Specific examples thereof include 1,5-naphthalenecarbodiimide, 4,4'-diphenylmethanecarbodiimide, 4,4'-diphenyldimethylmethanecarbodiimide, 1,3-phenylenecarbodiimide, 1,4-phenylenediisocyanate, 2,4-tolylenecarbodiimide, 2,6-tolylenecarbodiimide, a mixture of 2,4-tolylenecarbodiimide and 2,6-tolylenecarbodiimide, hexamethylenecarbodiimide, cyclohexane-1,4-carbodiimide, xylylenecarbodiimide, isophoronecarbodiimide, isophoronecarbodiimide, dicyclohexylmethane-4,4'-carbodiimide, methylcyclohexanedicarbodiimide, tetramethylxylylenecarbodiimide, 2,6-diisopropylphenylcarbodiimide and 1,3,5-triisopropylbenzene-2,4-carbodiimide.

A carbodiimide compound generates an isocyanate gas through thermal decomposition, and thus a carbodiimide compound having high heat resistance is preferably used. For enhancing the heat resistance, the molecular weight (polymerization degree) thereof is preferably as high as possible, and a carbodiimide compound having a terminal structure that has high heat resistance is more preferred. A carbodiimide compound is liable to be decomposed after once undergoing decomposition, and therefore such a procedure may be necessarily used that the extrusion temperature of the polyester is made lower as much as possible.

The carbodiimide as the terminal blocking agent preferably has a cyclic structure (for example, those described in JP-A-2011-153209). The compound may exhibit, irrespective of the low molecular weight thereof, the effects equivalent to the carbodiimide compound having a large molecular weight. This is because the terminal carboxyl group of the polyester, and the cyclic carbodiimide undergo ring-opening reaction, and one of them is reacted with the polyester, whereas the other thereof having been ring-opened is reacted with another polyester to increase the molecular weight. Accordingly, the cyclic carbodiimide compound described in JP-A-2011-153209 is effective for suppressing an isocyanate gas from being generated.

In the compound having a cyclic structure, the terminal blocking agent in the invention is preferably a carbodiimide compound having a carbodiimide group, the first nitrogen atom and the second nitrogen atom of which are bonded via a linking group. Furthermore, the terminal blocking agent is more preferably a carbodiimide compound having at least one carbodiimide group that is adjacent to the aromatic ring, in which the first nitrogen and the second nitrogen of the carbodiimide group adjacent to the aromatic ring are bonded via a linking group (which may be referred to as an aromatic cyclic carbodiimide).

The aromatic cyclic carbodiimide may have plural cyclic structures.

The aromatic cyclic carbodiimide is preferably an aromatic carbodiimide that does not have two or more cyclic structures formed by bonding the first nitrogen and the second nitrogen thereof via a linking group, i.e., a monocyclic compound, from the standpoint of preventing the viscosity from being increased.

The cyclic structure has one carbodiimide group (—N═C═N—), and the first nitrogen atom and the second nitrogen atom thereof are bonded via a linking group. While one cyclic structure has only one carbodiimide group, in the case where plural cyclic structures are contained in one molecule, such as a Spiro ring, the compound may have plural carbodiimide groups as far as the plural cyclic structures bonded to the Spiro atom each have one carbodiimide group. The number of atoms in the cyclic structure is preferably from 8 to 50, more preferably from 10 to 30, further preferably from 10 to 20, and particularly preferably from 10 to 15.

The number of atoms in the cyclic structure referred herein means the number of atoms that directly constitute the cyclic structure, and the number is 8 for an 8-membered ring and 50 for a 50-membered ring. When the number of atoms in the cyclic structure is less than 8, the cyclic carbodiimide compound may have deteriorated stability, which may cause difficulty in storage and use in some cases. The upper limit of the number of atoms of the ring is not particularly limited from the standpoint of the reactivity, but it is difficult to synthesize a cyclic carbodiimide compound having a number of atoms of the ring exceeding 50, and there are cases where the cost is considerably increased. In view of the circumstances, the number of atoms in the cyclic structure is preferably from 10 to 30, more preferably from 10 to 20, and particularly preferably from 10 to 15.

Specific examples of the carbodiimide terminal blocking agent having the cyclic structure include the following compounds. The invention is not limited to the specific examples.

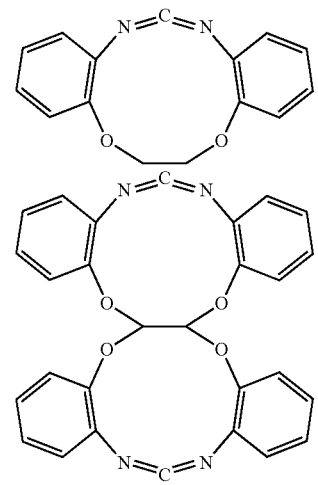

Epoxy Terminal Blocking Agent

Preferred examples of the epoxy compound include a glycidyl ester compound and a glycidyl ether compound.

Specific examples of the glycidyl ester compound include glycidyl benzoate, glycidyl t-butyl benzoate, glycidyl p-toluate, glycidyl cyclohexanecarboxylate, glycidyl pelargonate, glycidyl stearate, glycidyl laurate, glycidyl palmitate, glycidyl behenate, glycidyl versatate, glycidyl oleate, glycidyl linoleate, glycidyl linolenate, glycidyl behenolate, glycidyl stearolate, diglycidyl terephthalate, diglycidyl isophthalate, diglycidyl phthalate, diglycidyl naphthalenedicarboxylate, diglycidyl methylterephthalate, diglycidyl hexahydrophthalate, diglycidyl tetrahydrophthalate, diglycidyl cyclohexanedicarboxylate, diglycidyl adipate, diglycidyl succinate, diglycidyl sebacate, diglycidyl dodecanediolate, diglycidyl octadecanedicarboxylate, triglycidyl trimellitate and tetraglycidyl pyromellitate. These compounds may be used solely or as a combination of two or more kinds thereof.

Specific examples of the glycidyl ether compound include phenyl glycidyl ether, o-phenyl glycidyl ether, 1,4-bis(β,γ-epoxypropoxy)butane, 1,6-bis(β,γ-epoxypropoxy)hexane, 1,4-bis(β,γ-epoxypropoxy)benzene, 1-(β,γ-epoxypropoxy)-2-ethoxyethane, 1-(β,γ-epoxypropoxy)-2-benzyloxyethane, 2,2-bis[p-β,γ-epoxypropoxy)phenyl]propane, and a bisglycidyl polyether obtainable by reaction of a bisphenol, such as 2,2-bis(4-hydroxyphenyl)propane and 2,2-bis(4-hydroxyphenyl)methane, with epichlorohydrin. These can be used solely or as a combination of two or more kinds thereof.

The oxazoline compound used is preferably a bisoxazoline compound, and specific examples thereof include 2,2'-bis(2-oxazoline), 2,2'-bis(4-methyl-2-oxazoline), 2,2'-bis(4,4-dimethyl-2-oxazoline), 2,2'-bis(4-ethyl-2-oxazoline), 2,2'-bis(4,4'-diethyl-2-oxazoline), 2,2'-bis(4-propyl-2-oxazoline), 2,2'-bis(4-butyl-2-oxazoline), 2,2'-bis(4-hexyl-2-oxazoline), 2,2'-bis(4-phenyl-2-oxazoline), 2,2'-bis(4-cyclohexyl-2-oxazoline), 2,2'-bis(4-benzyl-2-oxazoline), 2,2'-p-phenylenebis(2-oxazoline), 2,2'-m-phenylenebis(2-oxazoline), 2,2'-o-phenylenebis(2-oxazoline), 2,2'-p-phenylenebis(4-methyl-2-oxazoline), 2,2'-p-phenylenebis(4,4-dimethyl-2-oxazoline), 2,2'-m-phenylenebis(4-methyl-2-oxazoline), 2,2'-m-phenylenebis(4,4-dimethyl-2-oxazoline), 2,2'-ethylenebis(2-oxazoline), 2,2'-tetramethylenebis(2-oxazoline), 2,2'-hexamethylenebis(2-oxazoline), 2,2'-octamethylenebis(2-oxazoline), 2,2'-decamethylenebis(2-oxazoline), 2,2'-ethylenebis(4-methyl-2-oxazoline), 2,2'-tetramethylenebis(4,4-dimethyl-2-oxazoline), 2,2'-9,9'-diphenoxyethanebis(2-oxazoline), 2,2'-cyclohexylenebis(2-oxazoline) and 2,2'-diphenylenebis(2-oxazoline). Among these, 2,2'-bis(2-oxazoline) is most preferably used from the standpoint of the reactivity with the polyester. The bisoxazoline compounds may be used solely or as a combination of two or more thereof as far as the object of the invention is achieved.

While examples of the terminal blocking agent include an epoxy compound, a carbodiimide compound, an oxazoline compound and a carbonate compound, a carbodiimide is preferred, and a carbodiimide having a cyclic structure is more preferred. This is because the compound has high reactivity with the terminal carboxylic acid of the polyester, such as PET, and furthermore is liable to be concentrated on the surface of the polyester, such as PET. In particular, the cyclic structure thereof provides a compact molecular structure, which may facilitate diffusion in the polyester, such as PET, and concentration to the surface thereof.

The molecular weight of the terminal blocking agent is preferably from 200 to 100,000, more preferably from 2,000 to 70,000, and further preferably from 5,000 to 50,000. The molecular weight referred herein means a weight average molecular weight. When the molecular weight exceeds the range, the terminal blocking agent may be reduced in mobility and thus may be difficult to be concentrated on the surface of the film. When the molecular weight is lower than the range, the terminal blocking agent may be increased in compatibility (affinity) with PET and thus is liable to stay inside the film, and thus the terminal blocking agent may be prevented from being concentrated on the surface, thereby failing to provide the aforementioned effect.

The amount of the terminal blocking agent added is preferably from 0.1 to 11% by mass, more preferably from 0.1 to 5% by mass, particularly preferably from 0.3 to 3% by mass, and further preferably from 0.5 to 2% by mass, based on the polyester support. When the amount is the lower limit or more, the sufficient concentration of the terminal blocking agent on the surface may be obtained, and thereby the in-plane distribution of the surface specific resistance of the conductive layer and the unevenness in thickness of the readily adhesive layer may be favorably within the ranges of the invention. When the amount of the terminal blocking agent is the upper limit or less, the concentration thereof on the surface may not be too large, and thereby the in-plane distribution of the surface specific resistance of the conductive layer and the unevenness in thickness of the readily adhesive layer may be favorably within the ranges of the invention.

Conductive Layer

The polyester film of the invention has a conductive layer that is provided at least one surface of the polyester support, the conductive layer has a surface specific resistance R0 of from $10^6$ to $10^{14}\Omega$ per square, and the surface specific resistance R0 of the conductive layer has an in-plane distribution of from 0.1 to 20%.

In-Plane Distribution of Surface Specific Resistance

The in-plane distribution of the surface specific resistance of the conductive layer is preferably from 0.1 to 20%, more preferably from 0.3 to 10%, further preferably from 0.5 to 5%, and still further preferably from 1 to 5%. When the in-plane distribution is the upper limit of the range or less, the conductivity may be difficult to be reduced (without too large unevenness and without a discontinuous conductive layer), and when the in-plane distribution is the lower limit of the range or more, the conductivity may be enhanced (the effect may be sufficiently exhibited).

Surface Specific Resistance

The surface specific resistance of the conductive layer is from $10^6$ to $10^{14}\Omega$ per square, preferably from $10^7$ to $10^{13}\Omega$ per square, and more preferably from $10^8$ to $10^{12}\Omega$ square. When the surface specific resistance is the upper limit of the range or less, the conductive layer may not be too thick and may form the non-uniformity described above to provide reduction (improvement) of the surface specific resistance. When the surface specific resistance is the lower limit of the range of more, the conductive layer may not be too thin and may not be discontinuous, and thus the conductive layer may form the non-uniformity described above to provide reduction of the surface specific resistance.

The reduction of the surface specific resistance of the conductive layer may enhance the withstand voltage. It is the ordinary procedure that a polyester support is necessarily increased in thickness for enhancing the withstand voltage thereof, but in the invention, the withstand voltage may be increased without increase of the thickness of the polyester support, thereby reducing the cost. The reason why the withstand voltage is enhanced by decreasing the surface specific resistance is that the voltage applied on measuring the withstand voltage is locally increased but is dispersed by the conductive layer (see paragraphs [0009] to [0010] of JP-A-2009-158952).

Thickness

The thickness of the conductive layer is preferably from 0.01 to 50 μm. When the thickness is the lower limit or more, the conductive layer may not be too thin to provide sufficient conductivity. When the thickness is the upper limit or less, the conductive layer may not be too thick to facilitate the formation of the in-plane distribution of the surface specific resistance of the conductive layer. The thickness is more preferably from 0.1 to 30 μm, and further preferably from 0.3 to 10 μm.

Thickness Distribution

The thickness distribution of the conductive layer is preferably from 0.1 to 10%, more preferably from 0.2 to 8%, and further preferably from 0.3 to 6%.

When the thickness distribution of the conductive layer is in the range, the in-plane distribution of the surface specific resistance of the conductive layer may be easily achieved.

Composition of Conductive Layer (1) Conductive Agent

In the film for a back sheet of a solar cell of the invention, a component that exhibits conductivity may be contained in the conductive layer. As the component that exhibits conductivity, any of an organic conductive material, an inorganic conductive material and an organic-inorganic hybrid conductive material may be preferably used.

Examples of the organic conductive material include an ionic conductive material, for example, a cationic conductive compound having a cationic substituent, such as an ammonium group, an amine salt group and a quaternary ammonium group, in the molecule thereof, an anionic conductive compound having an anionic substituent, such as a sulfonate salt group, a phosphate salt group and a carboxylate salt group, in the molecule thereof, and an amphoteric conductive compound having both an anionic substituent and a cationic substituent, and a conductive polymer compound having a conjugated polyene skeleton, such as polyacetylene, poly-p-phenylene, polyaniline, polythiophene, poly-p-phenylene vinylene and polypyrrole.

The conductive material may be introduced to a material to be a matrix constituting the conductive layer by the following methods (1) to (4), and any kind thereof may be preferably used. According to the procedure, the conductivity of the conductive layer may be exhibited. Specifically, the conductivity may be exhibited by the following methods, any of which may be preferably used.

(1) A skeleton having conductivity is copolymerized to a material to be a matrix.

(2) A conductive material is added to, mixed with or dissolved in a material to be a matrix.

(3) A conductive material is added to or mixed with a material to be a matrix, and then the conductive material is transferred to the surface and concentrated in the vicinity of the surface.

(4) A conductive material is added to or mixed in and dispersed in a material to be a matrix, thereby forming a conductive network.

Among the compounds (conductive materials), in the case where the film is formed from a solution and the case where the conductive layer is formed by coating on a polyester support, an ionic conductive material is preferred since it has a high conductivity on application of a high voltage, and a cationic conductive compound is more preferred since it has an effect of enhancing the coating property, the adhesion property and the partial discharge voltage for a prolonged period of time. The conductive compound used may be preferably any of a low molecular weight conductive compound and a high molecular weight conductive compound, and in the invention, a high molecular weight conductive compound is preferably used from the standpoint of the durability and the like. In the case where the method (4) is applied to the case where the conductivity is imparted to the conductive layer by melt extrusion, a polyetheramide copolymer compound that is dispersed in the matrix to form a conductive network, such as Irgastat P Series, produced by Ciba Specialty Chemicals Co., Ltd., is preferably used since it is excellent in the heat resistance and the hygrothermal resistance of the conductive layer.

The organic conductive material used may be a water soluble compound or a water insoluble compound, both of which are preferably used, and a water insoluble conductive compound is preferably used since the conductive layer of the film for a back sheet of a solar cell of the invention preferably has hygrothermal resistance. In the case of the ionic conductive material, the water solubility or water insolubility is determined by the species of the monomer constituting the material, and the water insolubility is determined by the copolymerization ratio of the monomer species having the functional group and the monomer species not having the functional group. The ratio of the molar number of the monomer species having the functional group and the molar number of the monomer species not having the functional group (i.e., (molar number of monomer species having the functional group)/(molar number of monomer species not having the functional group)) is preferably from 10/90 to 90/10, more preferably from 20/80 to 80/20, and further preferably from 30/70 to 70/30. When the ratio is 10/90 or more, it is preferred since the surface specific resistance R0 of the conductive layer thus formed may not be too high, and the enhancement of the partial discharge voltage may be lost. When the ratio is 90/10 or less, it is preferred since the water solubility may not be too high, and the conductive layer thus formed may have good hygrothermal resistance.

In the film for a back sheet of a solar cell of the invention, in the case where the conductive material used in the conductive layer is an organic conductive material, a water insoluble resin, such as a polyester resin, an acrylic resin, a polyolefin resin, a polyamide resin, polycarbonate, polystyrene, polyether, polyesteramide, polyethersulfone, polyvinyl chloride, polyvinyl alcohol, and copolymers formed of these materials, may be preferably used as a material to be a matrix constituting the conductive layer, in addition to the organic conductive material, for enhancing the hygrothermal resistance, the strength of the conductive layer, and the like. In the case where the conductive layer is formed by coating, the resin may be added to and mixed with the coating material, and in the case where the conductive layer is formed by melt extrusion, the resin may be mixed by melt kneading. In this case, even in the case where the organic conductive material is a water soluble conductive material, the hygrothermal resistance may be imparted, and the hydrothermal resistance may be enhanced as compared to the case of the water insoluble conductive material. The mixing ratio of the organic conductive material and the water insoluble resin (i.e., (weight of organic conductive material)/(weight of water insoluble resin)) is preferably from 5/95 to 50/50, and more preferably from 10/90 to 40/60. When the mixing ratio is 5/95 or more, it is preferred since the surface specific resistance R0 of the conductive layer may not be too high, and the partial discharge voltage may be enhanced, and when the mixing ratio is 50/50 or less, it is preferred since the conductive layer thus formed may have good hygrothermal resistance.

Examples of the water insoluble resin used in the case where the conductive layer is formed by melt extrusion include a polyester resin, such as polyethylene terephthalate (which may be hereinafter abbreviated as PET in some cases), polyethylene-2,6-naphthalate, polypropylene terephthalate, polybutylene terephthalate, poly-1,4-cyclohexylene dimethylene terephthalate and polylactic acid, a polyolefin resin, such as polyethylene, polystyrene, polypropylene, polyisobutylene, polybutene and polymethylpentene, a cycloolefin resin, a polyamide resin, a polyimide resin, a polyether resin, a polyesteramide resin, a polyether ester resin, an acrylic resin, a polyurethane resin, a polycarbonate resin, a polyvinyl chloride resin and a fluorine resin. Among these, the water insoluble resin is preferably constituted mainly by a thermoplastic resin selected from a polyester resin, a polyolefin resin, a cycloolefin resin, a polyamide resin, an acrylic resin, a fluorine resin, and mixtures thereof, from the standpoint of the multiplicity of the monomer species capable of being copolymerized, easiness in controlling the properties of the material thereby, and the like. In particular, the water insoluble resin is particularly preferably constituted by a polyester resin from the standpoint of the mechanical strength and the cost. Furthermore, the water insoluble resin is preferably oriented uniaxially or biaxially, whereby the mechanical strength thereof may be enhanced through orientation crystallization, and in the case of the polyester resin, the hydrolysis resistance of the conductive layer in the long-term use may be enhanced.

(2) Crosslinking Agent

In the case where the conductive material used in the conductive layer is an organic conductive material, a crosslinking agent is preferably contained in addition to the organic conductive material and the water insoluble resin, for further enhancing the hygrothermal resistance, for enhancing the adhesion property to the polyester support in the case where the conductive layer is formed by coating on the polyester support, and for preventing blocking of the film in the case where the film is formed by using a solution and the case where the conductive layer is formed by coating on the polyester support. Preferred examples of the crosslinking agent used include a resin and a compound that are capable of undergoing crosslinking reaction with the functional group present in the organic material and/or the resin constituting the water insoluble resin, such as a hydroxyl group, a carboxyl group, a glycidyl group and an amide group, and examples thereof include a methylolated or alkylolated urea resin, an acrylamide resin, a polyamide resin, an epoxy compound, an oxetane compound, an isocyanate compound, a coupling agent, an aziridine compound, an oxazoline compound, a carbodiimide compound, an acid anhydride, a carboxylate ester derivative, and mixtures thereof.

The kind of the crosslinking agent and the content thereof may be appropriately selected depending on the organic conductive material and the water insoluble resin constituting the conductive layer, the polyester support, and the like. The crosslinking agent in the back sheet film for a solar cell of the invention is preferably an oxazoline compound in the case where the film is formed by coating, the case where the conductive layer is formed by coating on the polyester support, and the case where the organic conductive material and/or the water insoluble resin has an acrylic skeleton, and is preferably a melamine compound in the case where the organic conductive material and/or the water insoluble resin has a polyester skeleton, from the standpoint that the conductive layer thus formed may be excellent in hygrothermal resistance. In the case where the conductive layer is formed by melt extrusion, and a polyester resin is used as the water insoluble resin, the crosslinking agent used is preferably an oxazoline compound, an epoxy compound, an oxetane compound, a carbodiimide compound, an acid anhydride or a carboxylate ester derivative.

The amount of the crosslinking agent added is generally preferably from 0.01 to 50 parts by mass, more preferably from 0.2 to 40 parts by mass, and further preferably from 0.5 to 30 parts by mass, per 100 parts by mass of the total resin components constituting the conductive layer.

A catalyst may be preferably used in combination with the crosslinking agent for accelerating the crosslinking reaction. The crosslinking reaction method may be any of a heating method, an electromagnetic wave irradiation method, a moisture absorbing method and the like, and a heating method may be generally preferably used.

In the film for a back sheet of a solar cell of the invention, in the case where the material constituting the conductive layer is an organic conductive material, the surface specific resistance R0 of the conductive layer may be determined by the effect of the terminal blocking agent contained in the polyester support, and in addition by the kind of the organic conductive material contained in the conductive layer, the kinds and the proportions of the water insoluble resin and the crosslinking agent mixed, the proportions of the other materials mixed, and the thickness. When the proportions of the water insoluble resin and the crosslinking agent with respect to the organic conductive material contained in the conductive layer are larger, the surface specific resistance R0 is larger, and when the proportions thereof are smaller, the surface specific resistance R0 is smaller. When the thickness of the conductive layer is larger, the surface specific resistance R0 is smaller, and when the thickness thereof is smaller, the surface specific resistance R0 is larger. The optimum values for the composition, the thickness and the like vary depending on the species of the materials used, the structure of the film, and the like, and the conductive layer is formed to have a surface specific resistance R0 that satisfies the aforementioned requirement.

In the case where the material constituting the conductive layer is an inorganic conductive material, examples thereof include materials containing as a major component an oxide, a suboxide and a hypooxide of a group of inorganic substances, such as gold, silver, copper, platinum, silicon, boron, palladium, rhenium, vanadium, osmium, cobalt, iron, zinc, ruthenium, praseodymium, chromium, nickel, aluminum, tin, zinc, titanium, tantalum, zirconium, antimony, indium, yttrium, lanthanum, magnesium, calcium, cerium, hafnium and barium, and mixtures of the group of inorganic substances and an oxide, a suboxide and a hypooxide of the group of inorganic substances (which are hereinafter generically referred to as an inorganic oxide), materials containing as a major component a nitride, a subnitride and a hyponitride of the group of inorganic substances, and mixtures of the group of inorganic substances and a nitride, a subnitride and a hyponitride of the group of inorganic substances (which are hereinafter generically referred to as an inorganic nitride), materials containing as a major component a carbide, a subcarbide or a hypocarbide of the group of inorganic substances, and mixtures of the group of inorganic substances and a carbide, a subcarbide or a hypocarbide of the group of inorganic substances (which are hereinafter generically referred to as an inorganic carbide), materials containing as a major component a fluoride and/or a chloride and/or a bromide and/or an iodide (which are hereinafter generically referred to as a halide), a subhalide and a hypohalide of the group of inorganic substances, and mixtures of the group of inorganic substances and a halide, a subhalide and a hypohalide of the group of inorganic substances (which are hereinafter generically referred to as an inorganic halide), mixtures of the group of inorganic substances and a sulfide, a subsulfide and a hyposulfide of the group of inorganic substances (which are hereinafter generically referred to as an inorganic sulfide), the aforementioned compounds having been doped with a hetero element, carbon compounds, such as graphite carbon, diamond-like carbon, carbon fibers, carbon nanotubes and fullerene (which are hereinafter generically referred to as a carbon compound), and mixtures of these materials. These materials may be at least contained in the conductive layer, and in the case where the thickness of the conductive layer is 1 μm or less, these materials are preferably contained as a major component for achieving the surface specific resistance of the conductive layer within the aforementioned range. The major component herein means a component that is contained in 50% by weight or more in the layer.

In the case where the material constituting the conductive layer is an inorganic conductive material, the surface specific resistance R0 of the conductive layer may be determined by the effect of the terminal blocking agent contained in the polyester support, and in addition by the degree of modification (such as oxidation, nitration, oxynitration, carbonation, halogenation, sulfuration and the like) of the group of inorganic substances contained in the film, the mixing ratio of the group of inorganic substances and the modified group of inorganic substances, the mixing ratio with another material, and the thickness. When the degree of modification of the group of inorganic substances is larger, the surface specific resistance R0 of the conductive layer is larger, and when the degree of modification thereof is smaller, the surface specific resistance R0 is smaller. When the proportion of the modified group of inorganic substances with respect to the group of inorganic substances contained in the conductive layer is larger, the surface specific resistance R0 is larger, when the proportion thereof is smaller, the surface specific resistance R0 is smaller. When the thickness of the conductive layer is larger, the surface specific resistance R0 is smaller, and when the thickness thereof is smaller, the surface specific resistance R0 is larger. The optimum values for the composition, the thickness and the like vary depending on the species of the metals used, the modification method, and the like, and the conductive layer is formed to have a surface specific resistance R0 that satisfies the aforementioned requirement.

In the case where the material constituting the conductive layer is an organic-inorganic hybrid conductive material (for example, (i) the case where a nonconductive water insoluble resin is used as a matrix, and an inorganic conductive material is used as a conductive material, (ii) the case where an organic conductive material and an inorganic conductive material are used in combination, (iii) the case where an organic conductive material and an inorganic nonconductive material are used in combination, (iv) the case where a nonconductive water insoluble resin is dispersed in an inorganic conductive material, and the like), the conductive layer may be constituted by combining appropriately the organic conductive materials, the inorganic conductive materials, the water insoluble resins and the crosslinking agents, which are described above, and an inorganic nonconductive material.

Examples of the case (i) include a structure containing a water insoluble resin used as a matrix, in which an inorganic conductive material is dispersed. The water insoluble resin used may be preferably those used in the organic conductive material. The shape of the inorganic conductive material dispersed in the water insoluble resin as a matrix of the conductive layer is not particularly limited, and may be a true spherical shape, an ellipsoidal shape, a tabular shape, a connected beads shape, a plate shape, an acicular shape and the like. A structure, in which fine particles are connected two-dimensionally or three-dimensionally in the water insoluble resin, may also be used. The inorganic particles may be formed of a single element or plural elements.

The inorganic conductive material used is preferably an metal oxide, such as zinc oxide, titanium oxide, cesium oxide, antimony oxide, tin oxide, indium tin oxide, yttrium oxide, lanthanum oxide, zirconium oxide, aluminum oxide and silicon oxide, or carbon fine particles, such as carbon black, carbon fibers, carbon nanotubes and fullerene, from the standpoint of the easiness in dispersion thereof in a noncompatible resin as a matrix of the conductive layer. The average particle diameter of the inorganic conductive material may be arbitrarily determined and is preferably from 0.001 to 20 µm, more preferably from 0.005 to 10 µm, particularly preferably from 0.01 to 1 µm, and further preferably from 0.02 to 0.5 µm. The particle diameter referred herein means a median diameter d50. When the particle diameter is 0.001 µm or less, it is not preferred since the particles may be difficult to be dispersed in the water insoluble resin as the matrix in some cases, and when the diameter is 20 µm or more, it may be difficult to form a uniform conductive layer. When the average particle diameter of the inorganic conductive material is from 0.001 to 20 µm, both the conductivity and the uniformity of the film may be achieved simultaneously.

A crosslinking agent may be preferably contained for further enhancing the mechanical strength and the hygrothermal resistance, for enhancing the adhesion to the polyester support in the case where the conductive layer is formed by coating on the polyester support, and for preventing blocking of the film in the case where the film is formed by using a solution and the case where the conductive layer is formed by coating on the polyester support. The crosslinking agent used herein may be a similar one as used in the organic conductive material.

As examples of the cases (ii) and (iii), in the case where an organic conductive material is used as the conductive material, fine particles may be preferably contained in addition to the water insoluble resin and the crosslinking agent, for enhancing the slipping property of the conductive layer, for imparting antiblocking property thereto, for controlling the glossiness and the surface specific resistance thereof, and the like. Examples thereof used include inorganic fine particles and organic fine particles. Examples of the inorganic fine particles include fine particles formed of an inorganic conductive material, for example, a metal, such as gold, silver, copper, platinum, palladium, rhenium, vanadium, osmium, cobalt, iron, zinc, ruthenium, praseodymium, chromium, nickel, aluminum, tin, zinc, titanium, tantalum, zirconium, antimony, indium, yttrium and lanthanum, a carbon compound, such as graphite carbon and diamond-like carbon, carbon nanotubes, and fullerene, and fine particles formed of an inorganic nonconductive material, for example, a metal oxide, such as zinc oxide, titanium oxide, cesium oxide, antimony oxide, tin oxide, indium tin oxide, yttrium oxide, lanthanum oxide, zirconium oxide, aluminum oxide and silicon oxide, a metal fluoride, such as lithium fluoride, magnesium fluoride, aluminum fluoride and cryolite, a metal phosphate, such as calcium phosphate, a carbonate salt, such as calcium carbonate, a sulfate salt, such as barium sulfate, and talc and kaolin. The particle diameter (number average particle diameter) of the fine particles is preferably from 0.05 to 15 µm, and more preferably from 0.1 to 10 µm. The content thereof is preferably from 5 to 50% by mass, more preferably from 6 to 30% by mass, and further preferably from 7 to 20% by mass, based on the total resin component constituting the conductive layer. When the particle diameter of the particles contained is in the range, it is preferred since the surface slipping property may be imparted, and the surface glossiness may be controlled, while controlling the surface specific resistance to the aforementioned range.

Examples of the case (iv) include a structure having a laminated structure of two or more layers including at least the conductive layer and the polyester support, in which a nonconductive water insoluble resin is dispersed in the inorganic conductive material constituting the conductive layer. The inorganic conductive material used may be a similar one as the aforementioned inorganic conductive material. The shape of the water insoluble resin dispersed in the inorganic conductive material is not particularly limited, and may be a true spherical shape, an ellipsoidal shape, a tabular shape, a connected beads shape, a plate shape, an acicular shape and the like. A structure, in which fine particles of the water insoluble resin are connected two-dimensionally or three-dimensionally in the inorganic conductive material, may also be used. The water insoluble resin may be formed of a single resin or plural resins.

The water insoluble resin used may be a similar one as used in the organic conductive material, and in addition, crosslinked fine particles, such as a silicone compound, a crosslinked styrene compound, a crosslinked acrylic compound and a crosslinked melamine compound, may also be used.

The conductive agent used in the conductive layer may include an organic one and an inorganic one, and an organic one is preferred since the surface non-uniform structure of the conductive layer may be easily formed. An organic conductive agent may be coated with a uniform solution, and thus the coating unevenness may be easily formed through the intermolecular mutual action of the conductive agent and the terminal blocking agent in the polyester film, but the coating unevenness may be difficult to be formed with an inorganic conductive agent since an inorganic conductive agent is coated with a non-uniform system.

Readily Adhesive Layer

The film described in Patent Literature 2 as a back sheet for a solar cell is wound up into a roll form in an ordinary manner, and then the necessary back sheet for a solar cell is wound off, the readily adhesive layer of which is then adhered to a sealant of a solar cell module. It has been found that there is a problem in adhesion property to cause a high occurrence rate of detachment.

In a preferred embodiment of the polyester film of the invention, on the other hand, the conductive layer having non-uniform in-plane distribution of the surface specific resistance provided improves the adhesion property of a readily adhesive layer that is provided as the outermost layer of the polyester film. While not sticking to any theory, firstly, the conductive layer having non-uniform in-plane distribution of the surface specific resistance may effectively reduce the static charge on the surface of the film, thereby preventing dusts (foreign matters) from being adsorbed on the surface in the formation of the film. The polyester film after the film formation is generally wound up to make the conductive layer in contact with the readily adhesive layer as the back surface, and dusts attached to the conductive layer may abrade and damage the readily adhesive layer. On adhering the readily adhesive layer to a sealant of a solar cell module, the damages are liable to reduce the adhesion property (detachment may occur from the damage as a starting point), and therefore the adhesion property of the readily adhesive layer of the polyester film of the invention may be improved by preventing dusts (foreign matters) from being adsorbed on the surface in the formation of the film. Secondly, static charge may be easily relieved with portions having a large conductivity that are locally present, and therefore in the polyester film of the invention having a distribution of the surface specific resistance, static charge generated on contact of the film wound up into a roll form may be relieved to prevent dusts from being attached to the conductive layer on storing the roll and after winding off the roll, thereby enhancing the adhesion property of the readily adhesive layer.

Thickness Unevenness

The adhesion force of the readily adhesive layer may be enhanced by imparting a thickness unevenness of from 0.1 to 10% thereto. The thickness unevenness is more preferably from 0.3 to 8%, and further preferably from 0.5 to 5%.

The thickness unevenness provided in the readily adhesive layer may prevent occurrence of damages due to contact (abrasion) of the front surface and the back surface of the film on winding up into a roll form. The thickness unevenness, i.e., surface unevenness, in the readily adhesive layer may prevent the polyester film of the invention from being in contact with each other over the entire surface thereof, and thereby damages due to grinding of the film may be prevented from occurring. The damages formed thereon may induce adhesion failure from the damages as a starting point, and the likelihood of damages may be avoided by imparting the thickness unevenness to the readily adhesive layer.

When the thickness unevenness of the readily adhesive layer exceeds the aforementioned range, it is not preferred since the convex portions may be too high to cause slippage between the front surface and the back surface of the film, which may induce damages. When the thickness unevenness of the readily adhesive layer is smaller than the range, the effect may not be obtained.

Thickness

The thickness of the readily adhesive layer is preferably from 0.01 to 10 µm, more preferably from 0.03 to 5 µm, and further preferably from 0.05 to 2 µm. When the thickness is smaller than the range, the effect of the readily adhesive layer may be reduced to lower the adhesion force, and when the thickness exceeds the range, the adhesion force may be lowered due to cohesion failure occurring in the readily adhesive layer. The cohesion failure may particularly effectively function under severe conditions (conditions where cohesion failure is liable to occur due to the progress of breakage of molecules), such as a hygrothermal test.

Composition of Readily Adhesive Layer (1) Polymer Binder

The readily adhesive layer preferably contains a polymer binder. In the case where a polymer binder is contained, the polymer binder is preferably contained in an amount of from 30 to 90% by weight per 100% by weight of the solid content. When the amount is less than 30% by weight, it is not preferred since the coated layer may be brittle to fail to maintain adhesion property to EVA, and when the amount exceeds 90% by weight, it is not preferred since the amount of polyvinyl alcohol added may be relatively decreased to lower the adhesion property to EVA.

Preferred examples of the polymer binder used include a polyester resin and an acrylic resin. The resins preferably have a glass transition point of from 20 to 100° C., and more preferably from 30 to 90° C. When the glass transition point is less than 20° C., it is not preferred since blocking of the films may occur, and when the glass transition point exceeds 100° C., it is not preferred since the coated layer may be brittle to fail to maintain adhesion property.

Preferred examples of the binder contained in the readily adhesive layer include an acrylic resin, a polyurethane resin, a polyester resin, a polyolefin resin and a melamine resin. These resins are preferred since they have a polarity that is close to a polyester to provide good adhesion force.

Polyurethane Binder

The polyurethane resin used in the readily adhesive layer in the invention is not particularly limited, and examples thereof include a resin containing a blocked isocyanate group, e.g., a thermal reactive water soluble polyurethane having a terminal isocyanate group blocked with a hydrophilic group. Examples of the blocking agent for blocking the isocyanate group with a hydrophilic group include a bisulfite salt, a phenol compound containing a sulfonic acid group, an alcohol compound, a lactam compound, an oxime compound and an active methylene compound. The blocked isocyanate group hydrophilizes or water-solubilizes the urethane prepolymer. In the drying step or the heat setting step in the production of the film, the blocking agent is released off from the isocyanate group by applying heat energy to the polyurethane resin, and the polyurethane resin fixes the mixed water dispersible copolymer polyester resin in the network formed by self-crosslinking, and simultaneously is reacted with the terminal group of the copolymer polyester resin, and the like. The resin during the preparation of the coating liquid is hydrophilic and thus has poor water resistance, but after completing thermal reaction through coating, drying and heat setting, the hydrophilic group of the urethane resin, i.e., the blocking agent, is released off, and thus a coated film having good water resistance is obtained. Among the blocking agents, a bisulfite salt is most preferred from the standpoint that the blocking agent is released off from the isocyanate group at the heat treating temperature and the heat treating time in the production process of the film, and the compound is industrially available.

The chemical composition of the urethane prepolymer used in the resin may be (1) an organic polyisocyanate having two or more active hydrogen atoms in the molecule or a compound having a molecular weight of from 200 to 20,000 having at least two active hydrogen atoms in the molecule, (2) an organic polyisocyanate having two or more isocyanate groups in the molecule, or (3) a compound having a terminal isocyanate group obtained by reacting a chain extending agent having at least two active hydrogen atoms in the molecule.

Ordinarily known examples of the compound (1) include compounds having two or more of a hydroxyl group, a carboxyl group, an amino group or a mercapto group, and particularly preferred examples of the compound include a polyether polyol, a polyester polyol and a polyether ester polyol. Examples of the polyether polyol include an alkylene oxide compound, such as ethylene oxide and propylene oxide, a compound obtained by polymerizing styrene oxide, epichlorohydrin or the like, a compound obtained by random-copolymerizing or block-copolymerizing them, and a compound obtained by addition-polymerizing a polyhydric alcohol with them.

Polyester Binder

Examples of the polyester resin having a glass transition point in a range of from 20 to 100° C. include ones formed from a polybasic acid or an ester forming derivative thereof and a polyol and an ester forming derivative thereof shown below. Specifically, examples of the polybasic acid component include terephthalic acid, isophthalic acid, phthalic acid, phthalic anhydride, 2,6-naphthalenedicarboxylic acid, 1,4-cyclohexanedicarboxylic acid, adipic acid, sebacic acid, trimellitic acid, pyromellitic acid, dimer acid and 5-sodium sulfoisophthalate. Two or more kinds of the acid components are preferably used to synthesize a copolymer polyester resin. A small amount of an unsaturated acid component, such as maleic acid and itaconic acid, and a hydroxycarboxylic acid, such as p-hydroxybenzoic acid, may be used in combination. Examples of the polyol component include ethylene glycol, 1,4-butanediol, diethylene glycol, dipropylene glycol, 1,6-hexanediol, 1,4-cyclohexanedimethanol, xylene glycol, dimethylolpropane, poly(ethylene oxide) glycol and poly(tetramethylene oxide) glycol.

Acrylic Binder

Examples of the acrylic resin having a glass transition point in a range of from 20 to 100° C. include acrylic resins obtained by polymerizing acrylic monomers exemplified below. Examples of the acrylic monomer include an alkyl acrylate and an alkyl methacrylate (examples of the alkyl group include a methyl group, an ethyl group, a n-propyl group, an isopropyl group, a n-butyl group, an isobutyl group, a t-butyl group, a 2-ethylhexyl group and a cyclohexyl group); a hydroxyl group-containing monomer, such as 2-hydroxyethyl acrylate, 2-hydroxyethyl methacrylate, 2-hydroxypropyl acrylate and 2-hydroxypropyl methacrylate; an epoxy group-containing monomer, such as glycidyl acrylate, glycidyl methacrylate and allyl glycidyl ether; a monomer having a carboxyl group, a sulfoxy group or salts thereof, such as acrylic acid, methacrylic acid, itaconic acid, maleic acid, fumaric acid, crotonic acid, styrenesulfonic acid, and salts thereof (e.g., a sodium salt, a potassium salt, an ammonium salt and a tertiary amine salt); a monomer having an amide group, such as acrylamide, methacrylamide, an N-alkylacrylamide, an N-alkylmethacrylamide, an N,N-dialkylacrylamide and an N,N-dialkylmethacrylamide (examples of the alkyl group include a methyl group, an ethyl group, a n-propyl group, an isopropyl group, a n-butyl group, an isobutyl group, a t-butyl group, a 2-ethylhexyl group and a cyclohexyl group), an N-alkoxyacrylamide, an N-alkoxymethacrylamide, an N,N-dialkoxyacrylamide and an N,N-dialkoxymethacrylamide (examples of the alkoxy group include a methoxy group, an ethoxy group, a butoxy group and an isobutoxy group), acryloylmorpholine, N-methylolacrylamide, N-methylolmethacrylamide, N-phenylacrylamide and N-phenylmethacrylamide; an acid anhydride monomer, such as maleic anhydride and itaconic anhydride; and other monomers, such as vinylisocyanate, allylisocyanate, styrene, α-methylstyrene, vinyl methyl ether, vinyl ethyl ether, vinyltrialkoxysilane, an alkyl monomaleate, an alkyl monofumalate, an alkyl monoitaconate, acrylonitrile, methacrylonitrile, vinylidene chloride, ethylene, propylene, vinyl chloride, vinyl acetate and butadiene.

Among these, a monomer containing a hydroxyl group, such as 2-hydroxyethyl acrylate, 2-hydroxyethyl methacrylate, 2-hydroxypropyl acrylate, 2-hydroxypropyl methacrylate, N-methylolacrylamide and N-methylolmethacrylamde, is preferably contained in an amount of from 2 to 20% by mol, and more preferably from 4 to 15% by mol.

Polyolefin Binder

A polyolefin binder, such as a rubber resin, e.g., SBR, may also be preferred, by which the adhesion force may be enhanced through absorption of the detachment stress due to the flexible structure thereof (the materials described, for example, in JP-A-61-60424, Japanese Patent No. 2,583,455, Japanese Patent No. 3,626,305, Japanese Patent No. 3,783,989, Japanese Patent No. 4,041,784 and Japanese Patent No. 4,505,402 may be used). Preferred examples of the polyolefin binder used also include a polyvinyl alcohol (PVA) resin. This is because it has high affinity to a polyvinyl alcohol resin that is laminated on PET in the back sheet for a solar cell.

Preferred examples of the PVA binder include ones described in Example 1 in paragraph [0045] of JP-A-2006-335853.

Polyurethane Binder

The polyurethane resin used in the readily adhesive layer in the invention is not particularly limited, and examples thereof include a resin containing a blocked isocyanate group, e.g., a thermal reactive water soluble polyurethane having a terminal isocyanate group blocked with a hydrophilic group. Examples of the blocking agent for blocking the isocyanate group with a hydrophilic group include a bisulfite salt, a phenol compound containing a sulfonic acid group, an alcohol compound, a lactam compound, an oxime compound and an active methylene compound. The blocked isocyanate group hydrophilizes or water-solubilizes the urethane prepolymer. In the drying step or the heat setting step in the production of the film, the blocking agent is released off from the isocyanate group by applying heat energy to the polyurethane resin, and the polyurethane resin fixes the mixed water dispersible copolymer polyester resin in the network formed by self-crosslinking, and simultaneously is reacted with the terminal group of the copolymer polyester resin, and the like. The resin during the preparation of the coating liquid is hydrophilic and thus has poor water resistance, but after completing thermal reaction through coating, drying and heat setting, the hydrophilic group of the urethane resin, i.e., the blocking agent, is released off, and thus a coated film having good water resistance is obtained. Among the blocking agents, a bisulfite salt is most preferred from the standpoint that the blocking agent is released off from the isocyanate group at the heat treating temperature and the heat treating time in the production process of the film, and the compound is industrially available.

The chemical composition of the urethane prepolymer used in the resin may be (1) an organic polyisocyanate having two or more active hydrogen atoms in the molecule or a compound having a molecular weight of from 200 to 20,000 having at least two active hydrogen atoms in the molecule, (2) an organic polyisocyanate having two or more isocyanate groups in the molecule, or (3) a compound having a terminal isocyanate group obtained by reacting a chain extending agent having at least two active hydrogen atoms in the molecule.

Ordinarily known examples of the compound (1) include compounds having two or more of a hydroxyl group, a carboxyl group, an amino group or a mercapto group, and particularly preferred examples of the compound include a polyether polyol, a polyester polyol and a polyether ester polyol. Examples of the polyether polyol include an alkylene oxide compound, such as ethylene oxide and propylene oxide, a compound obtained by polymerizing styrene oxide, epichlorohydrin or the like, a compound obtained by random-copolymerizing or block-copolymerizing them, and a compound obtained by addition-polymerizing a polyhydric alcohol with them.

Preferred examples of the polyurethane binder include the urethane adhesive described in paragraph [0055] of JP-A-2006-332091, the coating liquid (1) described in Example 1 in paragraph [0083] of Japanese Patent No. 4,457,322, and the coating liquid A described in paragraph [0032] of JP-A-2006-175764.

Polyester Binder

The polyester binder preferably has a glass transition point in a range of from 20 to 100° C., which may be formed from a polybasic acid or an ester forming derivative thereof and a polyol and an ester forming derivative thereof shown below. Specifically, examples of the polybasic acid component include terephthalic acid, isophthalic acid, phthalic acid, phthalic anhydride, 2,6-naphthalenedicarboxylic acid, 1,4-cyclohexanedicarboxylic acid, adipic acid, sebacic acid, trimellitic acid, pyromellitic acid, dimer acid and 5-sodium sulfoisophthalate. Two or more kinds of the acid components are preferably used to synthesize a copolymer polyester resin. A small amount of an unsaturated acid component, such as maleic acid and itaconic acid, and a hydroxycarboxylic acid, such as p-hydroxybenzoic acid, may be used in combination. Examples of the polyol component include ethylene glycol, 1,4-butanediol, diethylene glycol, dipropylene glycol, 1,6-hexanediol, 1,4-cyclohexanedimethanol, xylene glycol, dimethylolpropane, poly(ethylene oxide) glycol and poly(tetramethylene oxide) glycol.

Preferred examples of the polyester binder include the coating liquid for a readily adhesive layer described in paragraph [0057] of JP-A-2006-253565, the coating liquid described in paragraph [0087] of Japanese Patent No. 4,547,644, the coating liquid containing a polyester polymer adhesive, an isocyanate crosslinking curing agent and a lubricant described in paragraph [0033] of Japanese Patent No. 3,777,725, the coating liquid for forming a readily adhesive layer described in paragraph [0090] of Japanese Patent No. 3,731,286, the coating liquid described in paragraph [0055] of JP-A-2009-269301, and the readily adhesive layer described in paragraph [0013] of JP-A-2009-241373.

Acrylic Binder

Examples of the acrylic resin having a glass transition point in a range of from 20 to 100° C. include acrylic resins obtained by polymerizing acrylic monomers exemplified below. Examples of the acrylic monomer include an alkyl acrylate and an alkyl methacrylate (examples of the alkyl group include a methyl group, an ethyl group, a n-propyl group, an isopropyl group, a n-butyl group, an isobutyl group, a t-butyl group, a 2-ethylhexyl group and a cyclohexyl group); a hydroxyl group-containing monomer, such as 2-hydroxyethyl acrylate, 2-hydroxyethyl methacrylate, 2-hydroxypropyl acrylate and 2-hydroxypropyl methacrylate; an epoxy group-containing monomer, such as glycidyl acrylate, glycidyl methacrylate and allyl glycidyl ether; a monomer having a carboxyl group, a sulfoxy group or salts thereof, such as acrylic acid, methacrylic acid, itaconic acid, maleic acid, fumaric acid, crotonic acid, styrenesulfonic acid, and salts thereof (e.g., a sodium salt, a potassium salt, an ammonium salt and a tertiary amine salt); a monomer having an amide group, such as acrylamide, methacrylamide, an N-alkylacrylamide, an N-alkylmethacrylamide, an N,N-dialkylacrylamide and an N,N-dialkylmethacrylamide (examples of the alkyl group include a methyl group, an ethyl group, a n-propyl group, an isopropyl group, a n-butyl group, an isobutyl group, a t-butyl group, a 2-ethylhexyl group and a cyclohexyl group), an N-alkoxyacrylamide, an N-alkoxymethacrylamide, an N,N-dialkoxyacrylamide and an N,N-dialkoxymethacrylamide (examples of the alkoxy group include a methoxy group, an ethoxy group, a butoxy group and an isobutoxy group), acryloylmorpholine, N-methylolacrylamide, N-methylolmethacrylamide, N-phenylacrylamide and N-phenylmethacrylamide; an acid anhydride monomer, such as maleic anhydride and itaconic anhydride; and other monomers, such as vinylisocyanate, allylisocyanate, styrene, α-methylstyrene, vinyl methyl ether, vinyl ethyl ether, vinyltrialkoxysilane, an alkyl monomaleate, an alkyl monofumalate, an alkyl monoitaconate, acrylonitrile, methacrylonitrile, vinylidene chloride, ethylene, propylene, vinyl chloride, vinyl acetate and butadiene.

Among these, a monomer containing a hydroxyl group, such as 2-hydroxyethyl acrylate, 2-hydroxyethyl methacrylate, 2-hydroxypropyl acrylate, 2-hydroxypropyl methacrylate, N-methylolacrylamide and N-methylolmethacrylamde, is preferably contained in an amount of from 2 to 20% by mol, and more preferably from 4 to 15% by mol.

Preferred examples of the acrylic binder used include the other resin component B-3 described in paragraph [0083] of JP-A-2006-152013, the acrylic resin described in paragraph of JP-A-2011-207047, and the acrylic resin described in paragraph [0014] of JP-A-2009-241373.

Furthermore, preferred examples of the melamine binder used include those described for the readily adhesive layer described in paragraph [0015] of JP-A-2009-241373.

Among the binders used in the readily adhesive layer, a polyester binder is particularly preferred. This is because the substrate film as the underlayer is the polyester support containing a polyester as a major component, and for forming a terminal blocking agent distribution thereon, a difference in affinity may be easily provided between the polyester (underlayer) having a high affinity and the terminal blocking agent having a low affinity, thereby facilitating the formation of thickness unevenness of the readily adhesive layer.

Specific examples thereof include the following.

Particularly preferred examples of the polyester binder include the readily adhesive layer described in paragraph [0013] and the coating liquid for a readily adhesive layer described in Example 1 in paragraph [0050] of JP-A-2009-241373. Polyesters having different Tg are preferably used as described in paragraphs [0024] to [0044] of WO 08/099,891, the melamine resin described in paragraphs [0045] to [0049] of the literature may also be added. Specifically, the coating liquids A1, B1 and C1 described in paragraphs [0077] to [0081] of WO 08/099,891 are preferably used. Furthermore, the composition containing polyester and melamine described in paragraphs [0024] to [0054] of JP-A-2006-21462 is preferably used, and specific examples thereof include the oxazoline-polyester mixed resin layer A (mixing ratio of oxazoline/polyester is 1/1 by mass) described in the example in paragraph [0127] of the literature.

(2) Crosslinking Agent

In the readily adhesive layer, a crosslinking compound may be present along with the polymer binder. The use of a crosslinking compound may form crosslinking in the readily adhesive layer or to the polyester support, thereby enhancing the adhesion strength. Examples of the crosslinking compound include an epoxy compound, a glycidyl compound, a melamine compound and an oxazoline compound. Examples of the crosslinking compound, which is an epoxy compound, include compounds represented by the following formula (I):

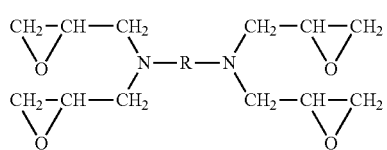
(I)

wherein R represents

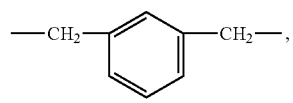

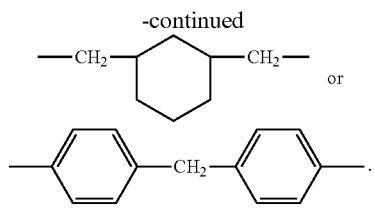
or

The crosslinking agent contained in the readily adhesive layer may further enhance the hygrothermal resistance. When the content thereof is less than 5% by weight, it is not preferred since the effect of enhancing the hygrothermal resistance may not be exhibited. When it is contained in an amount exceeding 20% by weight, it is not preferred since there are cases where the coated film is difficult to be formed, and as a result, the adhesion property to EVA is decreased.

(3) Additional Compound Having Epoxy Group

The readily adhesive layer may further contain an additional compound having an epoxy group in addition to the crosslinking agent. Examples of the compound include a polyepoxy compound, such as sorbitol polyglycidyl ether, polyglycerol polyglycidyl ether, pentaerythritol polyglycidyl ether, diglycerol polyglycidyl ether, triglycidyltris(2-hydroxyethyl)isocyanate, glycerol polyglycidyl ether and trimethylolpropane polyglycidyl ether, a diepoxy compound, such as neopenthylglycol diglycidyl ether, 1,6-hexanediol diglycidyl ether, resorcin diglycidyl ether, ethylene glycol diglycidyl ether, polyethylene glycol diglycidyl ether, propylene glycol diglycidyl ether, polypropylene glycol diglycidyl ether and polytetramethyleneglycol diglycidyl ether, and a monoepoxy compound, such as allyl glycidyl ether, 2-ethylhexyl glycidyl ether and phenyl glycidyl ether.

In the case where the epoxy compound is used in combination, the compound is preferably used in such an amount that the total amount of the crosslinking agent and the epoxy compound is preferably from 5 to 20% by weight per 100% by weight of the solid content of the coating liquid.

(4) Additional Additive

The readily adhesive layer may further contain a wetting agent, an antistatic agent, a colorant, a surfactant, an ultraviolet ray absorbent and the like. In the case where a wetting agent is contained, the content thereof may be, for example, from 1 to 20% by weight per 100% by weight of the solid content.

In the case where the readily adhesive layer contains the fine particles, the crosslinking agent and depending on necessity the wetting agent in a relatively large amount, the amount of the polymer binder may be relatively decreased to make the total amount of the solid content of 100% by weight.

Shape of Polyester Film

The polyester film of the invention may be in the form of a sheet or may be wound up into a roll form. In the polyester film of the invention, even though it is wound up into a roll form, static charge generated due to grinding of the film may be easily relieved to prevent dusts from being attached thereto. Accordingly, the polyester film of the invention that is wound up into a roll form may be further improved in the adhesion property of the readily adhesive layer, as compared to the ordinary ones.

Method for Producing Polyester Film

The method for producing a polyester film of the invention (which may be hereinafter referred to as a production method of the invention) contains a step of extruding a molten material of a polyester composition from a die and solidifying the composition by cooling, so as to produce a polyester support that has a terminal carboxylic acid value (AV) of from 3 to 20 eq/ton and IV of from 0.65 to 0.9 dL/g; and a step of forming a conductive layer on at least one surface of the polyester support, and the polyester support is cooled with air blow having an air blow amount with a modulation of from 0.1 to 10%.

In the method for producing a polyester film of the invention, the polyester composition is preferably a composition that contains as a major component a polyester component that satisfies at least one of the following conditions (A) and (B):

condition (A): the polyester component is a polyester composition that contains a polyester and a terminal blocking agent in an amount of from 0.1 to 10% by mass based on the polyester, and condition (B): the polyester component is a CHDM polyester that contains a structure derived from 1,4-cyclohexanedimethanol (CHDM) in an amount of from 0.1 to 20% by mol or from 80 to 100% by mol of a diol component.

Production of Polyester Support

The production method of the invention contains a step of extruding a molten material of a polyester composition from a die and solidifying the composition by cooling, so as to produce a polyester support that has a terminal carboxylic acid value (AV) of from 3 to 20 eq/ton and IV of from 0.65 to 0.9 dL/g, and the polyester support is cooled with air blow having an air blow amount with a modulation of from 0.1 to 10%.

Production of Polyester Support (1) Polyethylene Terephthalate (PET)

Polyethylene terephthalate is prepared. Polyethylene terephthalate may be produced by any one of the following processes. Specifically, the processes include (1) a process, in which terephthalic acid and ethylene glycol used as raw materials are subjected to direct esterification reaction to form low molecular weight polyethylene terephthalate or an oligomer thereof, which are then subjected to polycondensation reaction using antimony trioxide or a titanium compound as a catalyst to provide a polymer, and (2) a process, in which dimethyl terephthalate and ethylene glycol used as raw materials are subjected to ester exchange reaction to provide a low molecular weight material, which is then subjected to polycondensation reaction using antimony trioxide or a titanium compound as a catalyst to provide a polymer. The esterification may proceed without a catalyst, but in the ester exchange reaction, a compound of manganese, calcium, magnesium, zinc, lithium, titanium or the like is used to proceed the esterification, and after substantially completing the ester exchange reaction, a phosphorus compound may be added in some cases for the purpose of inactivating the catalyst used for the ester exchange reaction. The resulting PET pellets are preferably subjected to solid phase polymerization to increase the intrinsic viscosity thereof.

(2) Poly(1,4-cyclohexane Dimethylene Terephthalate) (PCT)

A polycyclohexanedimethyleneterephthalate (PCT) having the 1,4-cyclohexanedimethanol (CHDM) structure may be preferably produced by any one of (1) the ester exchange method and (2) the direct polymerization method, and for example, the method described in paragraphs [0089] to [0090] and [0120] to of WO 2009/125701 may also be preferably used.

(3) Polyethylene Naphthalate (PEN)

PEN may also be prepared by ester exchange reaction, and specifically, the methods described in paragraph [0170] of JP-A-2011-153209 and paragraphs [0046] and [0060] of JP-A-2008-39803 may also be preferably used.

In the production method of the invention, a molten material of a polyester composition is extruded from a die. The polyester composition is preferably a composition that contains as a major component a polyester component that satisfies at least one of the conditions (A) and (B).

As the method for containing the terminal blocking agent in the polyester constituting the film, such a method is effective that the terminal blocking agent is directly mixed with the polyester pellets and then kneaded into the polyester with a bent type twin-screw kneader extruder heated to a temperature of from 270 to 275° C. to prepare high concentration master pellets. The intrinsic viscosity IV of the polyester in this case is relatively higher than the ordinary one and is preferably from 0.7 to 1.6. The intrinsic viscosity IV is more preferably from 1.2 to 1.4. When the intrinsic viscosity IV is less than 0.7, the amount of the carboxyl terminal group of the master pellets may be too large to cause excessive reaction with the terminal blocking agent on forming the master pellets, and thus the effect of capping the terminal group on extruding the polyester may be reduced to fail to lower the amount of the carboxyl terminal group. When the intrinsic viscosity IV exceeds 1.6, the melt viscosity may be too large to make extrusion unstable, thereby failing to produce pellets. When the temperature of the extruder is increased to lower the melt viscosity, the terminal blocking agent may be decomposed to fail to exert the effect thereof in some cases.

The resulting polyester pellets thus obtained are dried, for example, under reduced pressure at a temperature of 180° C. for 3 hours or more, and then fed to an extruder heated to a temperature, for example, of from 265 to 280° C. (more preferably from 270 to 275° C.) under a nitrogen stream or under vacuum for preventing the intrinsic viscosity from being decreased, followed by extruding from a slit die.

Thereafter, the polyester is cooled on a casting roll to prepare an unstretched film. In this case, various kinds of filters formed of such a material as a sintered metal, porous ceramics, sand or a metallic mesh, are preferably used for removing foreign matters and altered polymers. Depending on necessity, furthermore, a gear pump may be used for enhancing the quantitative feeding property. In the case where the film is laminated, two or more extruders and manifold and a combining block may be used to melt and laminate plural kinds of polymers.

The melt (molten material) extruded from the die is solidified by cooling on a casting roll or the like to form an unstretched film, and in the production method of the invention, the polyester support is cooled with air blow having an air blow amount with a modulation of from 0.1 to 10%. Specifically, for example, cold air blow may be applied onto the casting roll to perform quenching, in which the wind speed of the cold air blow may be modulated.

It is preferred that the free volume of the center portion in the thickness direction of the polyester support is decreased with respect to the vicinity of the surface thereof, and thereby the terminal blocking agent in the polyester support is concentrated to the surface thereof (since the terminal blocking agent is liable to be present in the free volume). The molten material has a large free volume, and the free volume may be maintained large by solidifying the molten material while maintaining the free volume thereof. Accordingly, the decrease of the free volume is effectively performed during the solidification of the molten material. The aforementioned distribution of the free volume may be formed by quenching the surface of the film and slowly cooling the interior thereof. The structure of the molten material may be fixed by quenching to maintain the large free volume. On slowly cooling, on the other hand, the free volume may be decreased by following the temperature decrease.

In the production method of the invention, the quenching of the surface may be achieved by cooling the molten material extruded from the die with air blow having an air blow amount with a modulation of from 0.1 to 10%. While not sticking to any theory, increase and decrease of the air blow amount may break the fluid film formed on the surface of the film to enhance thermal conduction, and thus the film may be quenched effectively.

In the production method of the invention, the modulation of the air blow amount is preferably from 0.1 to 10%, and the modulation may be achieved by modulating the rotation number of the driving motor of the air blowing machine. The modulation is more preferably from 0.3 to 7%, and further preferably from 0.5 to 5%. When the modulation is the lower limit of the range of more, the polyester support may be sufficiently quenched to increase the free volume, which as a result facilitates concentration of the terminal blocking agent to the surface of the polyester support, thereby forming distributions in the conductive layer and the readily adhesive layer. When the modulation of the air blow amount is the upper limit of the range or less, it is preferred since the terminal blocking agent may be prevented from being concentrated excessively to the surface of the polyester support, the distributions of the conductive layer and the readily adhesive layer may be the upper limits in the invention or less.

In the description herein, the modulation of the air blow amount means a value in terms of percentage obtained by dividing the difference between the maximum wind speed and the minimum wind speed by the average wind speed on measuring the wind speed for one minute.

The average wind speed of the air blow on cooling the polyester support is preferably 40 to 70 m/sec, more preferably from 45 to 67 m/sec, and further preferably from 50 to 63 m/sec.

The polyester support is preferably in such an embodiment that the surface thereof is treated by a corona treatment, a flame treatment, a low pressure plasma treatment, an atmospheric pressure plasma treatment or an ultraviolet ray treatment. These surface treatments may be applied to the coated surface of the conductive layer and/or the readily adhesive layer before coating, and thereby the adhesion property on exposing to a hygrothermal environment may be further enhanced. In particular, a corona treatment performed may provide a further excellent effect of enhancing the adhesion property.

By subjecting the surface of the polyester support to the surface treatment, the amount of a carboxyl group and a hydroxyl group on the surface is increased to enhance the adhesion property between the polyester support and the coated layer, and a higher adhesion property may be obtained by using a crosslinking agent (particularly an oxazoline crosslinking agent or a carboxyimide crosslinking agent having high reactivity to a carboxyl group) in combination. The phenomenon may be conspicuous when a corona treatment is performed. Accordingly, the surface of the polyester support, on which a coated layer is to be provided, is preferably subjected to a corona treatment.

Formation of Conductive Layer

The production method of the invention contains a step of forming a conductive layer on at least one surface of the polyester support. In the production method of the invention, the conductive layer is preferably formed to be adjacent to the polyester layer that contains as a major component a polyester component that satisfies at least one of the conditions (A) and (B) of the polyester support.

Examples of the method for forming the conductive layer on the polyester support include a dry method, such as a vapor deposition method and a sputtering method, a wet method, such as a plating method, a method, in which the raw material for the polyester support and the raw material for the conductive layer are melted separately by using plural extruders, and co-extruded from a die onto a cooled casting drum to mold into a sheet form (i.e., a co-extrusion method), a method, in which the raw material for the conductive layer is placed in an extruder and melt-extruded from a die and laminated onto the polyester support having been formed as a single film (i.e., a melt-laminating method), a method, in which the polyester support and the conductive layer are produced separately and then adhered under heat and pressure with a group of heated rollers (i.e., a heat laminating method), a method of adhering them through an adhesive (i.e., an adhering method), a method, in which the raw material for the conductive layer is dissolved in a solvent, and the resulting solution is coated on the polyester support having been produced in advance (i.e., a coating method), and a method combining these methods.

In the case where the conductive layer is constituted by an organic material or an organic-inorganic hybrid conductive material of the case (i) to (iii), a co-extrusion method and a coating method are preferably used since the conductive layer may be easily formed.

In the case where the conductive layer is formed on the polyester support by a co-extrusion method, the raw material for the polyester support and the raw material for the conductive layer are melted separately by using plural extruders, co-extruded from a die, and solidified by cooling by making into contact through static charge to a drum cooled to a surface temperature of from 10 to 60° C., thereby providing a sheet containing the polyester support having formed thereon the conductive layer.

Examples of the method of forming the conductive layer on the polyester support by a coating method include an in-line coating method, in which the conductive layer is coated during the formation of the polyester support, and an off-line coating method, in which the conductive layer is coated on the polyester support after the formation thereof, any of which may be used, and an in-line coating method is more preferably used since the conductive layer may be coated simultaneously with the formation of the polyester support to enhance the efficiency, and the conductive layer may have high adhesion property to the polyester support. On coating the conductive layer, the surface of the polyester support is preferably subjected to a corona treatment or the like from the standpoint of enhancement of the wettability of the support to the coating liquid and enhancement of the adhesion property.

Preferred examples of the method of forming the conductive layer on the polyester support by the coating method include such a procedure that a coating liquid containing the materials constituting the conductive layer having been dissolved or dispersed in a solvent is coated and dried on the polyester support.

What is particularly preferred among these is the coating method, by which the distribution of the surface specific resistance may be easily provided. This is because a certain period of time is present until completing the formation of the film, and the distribution may be easily formed during the period of from coating to drying.

The production method of the invention preferably contains: a step of coating a coating liquid for a conductive layer on at least one surface of the polyester support; and a step of conveying the polyester support having the coating liquid for a conductive layer coated thereon, in a drying zone, so as to form the conductive layer, and a temperature distribution of from 0.1 to 10° C. is preferably applied at an outlet port of the drying zone. After coating and drying, the temperature distribution applied at the outlet port of the drying zone is more preferably from 0.5 to 8° C., and further preferably from 1 to 6° C. According to the procedure, temperature unevenness may be applied in the cooling step, and unevenness may be formed in the conductive layer by utilizing the difference in thermal expansion. As a result, the in-plane distribution of the surface specific resistance may be easily formed in the conductive layer. The reason why the temperature distribution in the cooling step is effective is that it is effective to form the unevenness immediately before solidifying the conductive layer by cooling (even through the unevenness is formed inside the drying zone, the unevenness may be uniformized until reaching the outlet port).

When the temperature distribution is the lower limit of the range or more, it is preferred since the distribution of the surface specific resistance may be easily provided. When the temperature distribution is the upper limit of the range or less, it is preferred since the distribution of the surface specific resistance may be prevented from being increased excessively.

In the procedure described in the example in paragraph [0131] of JP-A-2009-158952, the conductive layer is slowly cooled uniformly after coating, which is different from the method of the invention, in which a temperature distribution of from 0.1 to 10° C. is applied at an outlet port of the drying zone.

The temperature distribution at the outlet port of the drying zone may be achieved, for example, by imparting a distribution to the slit width of the warm air blowing nozzle in the drying zone, or by disturbing the air flow in the drying zone with baffle plate.

The temperature distribution at the outlet port of the drying zone referred in the description herein means the difference between the maximum temperature and the minimum temperature of the points measured with an interval of 10 cm in the width direction.

The average temperature of the drying zone is preferably from 150 to 250° C., more preferably from 160 to 230° C., and further preferably from 170 to 220° C.

The cooling herein means a step of cooling the polyester film to Tg thereof (69° C. for PET) or less.

In the case where stretching and thermal fixing are performed with a tenter subsequent to the coating of the coating liquid for the conductive layer, the tenter may be used as the drying zone, and the temperature distribution is preferably applied at the outlet port of the tenter.

The temperature unevenness in the cooling step of the coating liquid for the conductive layer may further effectively functions by combining with the application of the unevenness in wind speed in the cooling step in the production of the polyester support.

Formation of Readily Adhesive Layer

The production method of the invention preferably contains a step of forming a readily adhesive layer on at least one surface of the polyester support.

The method of forming the readily adhesive layer used may be the coating method described for the formation method of the conductive layer.

A back sheet for a solar cell module often has a readily adhesive layer that has a high polarity since it is to be adhered to EVA having a high polarity. As similar to the case of the conductive agent, a terminal blocking agent may be added to the polyester support to concentrate a resin having a high polarity to the vicinity of the surface of the polyester support, and thereby the compatibility between the readily adhesive layer and PET may be lowered to provide unevenness in coating.

In the case where the conductive layer and the readily adhesive layer are simultaneously coated, it is effective to provide unevenness in thickness in the readily adhesive layer through the similar mechanism.

A biaxially stretching method is then described, in which the unstretched film thus obtained is stretched in the machine direction by utilizing the difference in circumferential velocity among rolls in a longitudinal stretching machine (MD stretching) and subsequently stretched in the transverse direction by a tenter (TD stretching).

The unstretched film is preferably subjected to MD stretching firstly. In the MD stretching, the film may be stretched in two stages, i.e., firstly stretched at a low temperature and then stretched after increasing the temperature, thereby enhancing the orientation. In the initial low temperature stretching (MD stretching 1), the film may be heated with a group of heating rolls at a temperature of from (Tg−20) to (Tg+10)° C., and preferably from (Tg−10) to (Tg+5)° C., and stretched in the machine direction at a stretching ratio of from 1.1 to 3.0 times, more preferably from 1.2 to 2.5 times, and further preferably from 1.5 to 2.0 times, and then MD stretching 2 may be performed at a temperature higher than the MD stretching 1, i.e., (Tg+10) to (Tg+50)° C., and more preferably from (Tg+15) to (Tg+30)° C. The stretching ratio in the MD stretching 2 is preferably from 1.2 to 4.0 times, and more preferably from 1.5 to 3.0 times. The total MD stretching ratio, which is the sum of the MD stretching 1 and the MD stretching 2, is preferably from 2.0 to 6.0 times, more preferably from 3.0 to 5.5 times, and further preferably from 3.5 to 5.0 times. After stretching, the film is preferably cooled with a group of cooling rolls at a temperature of from 20 to 50° C.

Subsequently, the film is stretched in the transverse direction with a tenter. The stretching ratio therein is preferably from 2.0 to 6.0 times, more preferably from 3.0 to 5.5 times, and further preferably from 3.5 to 5.0 times. The temperature therein is preferably in a range of from (Tg) to (Tg+50)° C., and more preferably in a range of from (Tg) to (Tg+30)° C. (TD stretching).

After the TD stretching, the film is preferably subjected to a heat setting treatment, and for suppressing the orientation relaxation of the film, the heat treatment is preferably performed at a temperature that is lower than the ordinary procedure. In the heat setting treatment, the film is heat-treated at a temperature of preferably from 170 to 230° C., more preferably from 180 to 225° C., and further preferably from 190 to 220° C., while the film is under tension or is relaxed in the transverse direction. The heat treating time is preferably in a range of from 0.5 to 10 seconds. Thereafter, the film is cooled to 25° C., and the edges of the film are then removed, thereby providing the biaxially stretched polyester film of the invention.

Solar Cell Module

Ina solar cell having a laminated structure (transparent front substrate)/(device structure)/(back sheet), in which a transparent substrate disposed on the solar light incident side (i.e., a front substrate, such as a glass substrate), a device structure (including a solar cell device and a sealant that seals the solar cell device), and a back sheet for a solar cell are laminated, the polyester film of the invention may be applied to any of the front substrate and the back sheet. The back sheet herein means a back protective sheet that is disposed on the side where the front substrate is not disposed as viewed from the device structure of the cell substrate.

In the description herein, the cell part having a laminated structure (transparent front substrate)/(device structure), in which the transparent substrate is disposed on the solar light incident side, and the device structure is disposed thereon, is referred to as the cell substrate.

Specifically, the solar cell module of the invention contains a transparent substrate, on which the solar light is incident (i.e., a front substrate, such as a glass substrate), a device structure containing a solar cell device and a sealant for sealing the solar cell device, which is provided on the substrate, and the back sheet for a solar cell of the invention (containing the polyester film of the invention), which is disposed on the opposite side to the side where the substrate of the device structure is disposed, and thus has a laminated structure (transparent front substrate)/(device structure)/(back sheet). Specifically, the device structure having a solar cell device converting light energy of the solar light to electric energy is disposed between the transparent front substrate disposed on the side, on which the solar light is directly incident, and the back sheet for a solar cell of the invention having been described, and the device structure including a solar cell device (such as a solar cell) is sealed and adhered between the front substrate and the back sheet by using a sealant, such as an ethylene-vinyl acetate (EVA) material.

Figure 2:
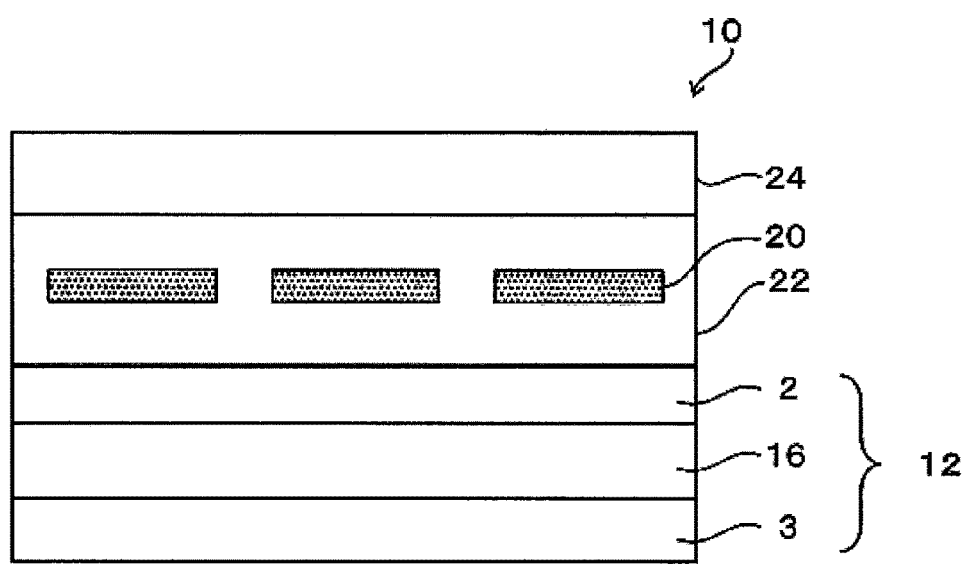
FIG. 2 is a schematic view showing an example of a cross section of a solar cell module using a polyester film according to the invention as a back sheet for a solar cell module.

FIG. 2 schematically shows an example of the solar cell module of the invention. The solar cell module 10 is constituted by disposing a solar cell device 20 converting light energy of the solar light to electric energy between the solar light incident transparent substrate 24 and the polyester film 12 of the invention having been described, and sealing the substrate and the polyester film 12 of the invention with an ethylene-vinyl acetate sealant 22. The polyester film of the invention in this embodiment, a readily adhesive layer 2 is provided on one surface of a polymer support 16 on the side of the sealant 22 (i.e., on the side where solar is incident), and a conductive layer 3 is provided on the other surface thereof.

For the other members than the solar cell module, the solar cell and the back sheet, details thereof are described, for example, in Taiyoko Hatsuden System Kosei Zairyo (Constitutional Materials for The solar light Power Generation Systems) (supervised by E. Sugimoto, Kogyo Chosakai Publishing Co., Ltd. (2008)).

The transparent substrate may have light transparency that enables transmission of the solar light, and may be appropriately selected from substrates that transmit the solar light. From the standpoint of the electric power generation efficiency, a substrate having a higher light transmittance is preferred, and preferred examples of the substrate include a glass substrate and a transparent resin substrate, such as an acrylic resin.

Examples of the solar cell device used include various known solar cell devices including a silicon solar cell device, such as single crystal silicon, polycrystalline silicon and amorphous silicon, and a III-V Group or II-VI Group compound semiconductor solar cell, such as copper-indium-gallium-selenium, copper-indium-selenium, cadmium-tellurium and gallium-arsenic.

EXAMPLES

The invention will be described more specifically with reference to examples below. The materials, the amounts used, the ratios, the contents of processes, the procedures of processes, and the like in the examples shown below may be appropriately changed unless they deviate from the substance of the invention. Accordingly, the scope of the invention is not construed as being limited to the specific examples shown below. The "part" is based on mass unless otherwise indicated.

Reference Example 1-1

Preparation of Polyester: PET 100 parts by mass of dimethyl terephthalate and 64 parts by mass of ethylene glycol were charged in an ester exchange reaction equipment, and the contents were dissolved by heating to a temperature of 140° C. Thereafter, while stirring the contents, 0.09 part by mass of calcium acetate and 0.03 part by mass of antimony trioxide were added thereto, and ester exchange reaction was performed at a temperature of from 140 to 230° C. while distilling methanol off. Subsequently, 0.18 part by mass of lithium acetate and 4.8 parts by mass of a 5% by weight ethylene glycol solution of trimethyl phosphate (0.24 part by mass of trimethyl phosphate) were added thereto.

After adding the ethylene glycol solution of trimethyl phosphate, the temperature of the reaction contents was decreased. Then, the contents were continuously stirred until the temperature of the reaction contents was returned to 230° C. while distilling excessive ethylene glycol off. After the temperature of the reaction contents in the ester exchange reaction equipment reached 230° C., the reaction contents were transferred to a polymerization equipment.

After transferring the reaction contents to the polymerization equipment, the reaction system is gradually heated from 230° C. to 290° C., and the pressure was lowered to 0.1 kPa. The period of time to reach the final temperature of 290° C. and that to reach the final pressure of 0.1 kPa were both 60 minutes. After achieving the final temperature and the final pressure, the reaction was performed for 2 hours (3 hours from the start of polymerization), and thus the stirring torque of the polymerization equipment exhibited the prescribed value (which was the value exhibited by the equipment with polyethylene terephthalate having an intrinsic viscosity of 0.55 while the value varied by the specification of the polymerization equipment). The reaction system was then purged with nitrogen and returned to ordinary pressure to terminate the polycondensation reaction, and the reaction product was discharged in the form of strands into cold water and immediately cut to provide a PET resin A (3 mm$^3$), which was pellets of polyethylene terephthalate PET having an intrinsic viscosity of 0.55 and a terminal carboxylic acid amount (AV) of 29.

Reference Example 1-2

Preparation of Polyester: PCT

First step: Isophthalic acid (IPA) and terephthalic acid (TPA) were used as a dicarboxylic acid component, and cyclohexanedimethanol (CHDM) and ethylene glycol (EG) were used as a diol component. The materials were melted with magnesium acetate and antimony trioxide as a catalyst at 150° C. in a nitrogen atmosphere, and heated to 230° C. under stirring over 3 hours while distilling methanol off, thereby completing esterfication reaction. At this time, the amounts of IPA, TPA, CHDM and EG added were changed to provide CHDM polyesters having the compositions described later.

Second step: After completing the esterfication reaction, an ethylene glycol solution containing phosphoric acid dissolved in ethylene glycol was added thereto.

Third step: Polymerization reaction was performed at a final temperature of 285° C. and a vacuum degree of 0.1 Torr to provide a polyester, which was pelletized to provide a PCT resin A (3 mm$^3$).

Reference Example 3

Preparation of Polyester: PEN 100 parts of dimethyl naphthalene-2,6-dicarboxylate and 60 parts of ethylene glycol were subjected to ester exchange reaction with 0.03 part of manganese acetate tetrahydrate as an ester exchange catalyst by gradually heating from 150° C. to 238° C. for 120 minutes. In the course of the reaction, at the time when the reaction temperature reached 170° C., 0.024 part of antimony trioxide was added, and after completing the ester exchange reaction, trimethyl phosphate (a solution heat-treated at 135° C. for 5 hours under pressure of from 0.11 to 0.16 MPa in ethylene glycol, trimethyl phosphate amount: 0.023 part) was added. Thereafter, the reaction product was transferred to a polymerization reactor and subjected to polycondensation reaction by heating to 290° C. in high vacuum of 27 Pa or less, thereby providing polyethylene 2,6-napthalenedicarboxylate having an intrinsic viscosity of 0.61 dL/g, which was designated as a PEN A.

Reference Example 2

The PET resin A and the PCT resin A, which were PET and PCT pellets respectively, obtained in Reference Examples 1-1 and 1-2 were subjected to solid phase polymerization by heat-treating at a temperature of 230° C. under reduced pressure of 0.1 kPa for the period of time shown in Table 1. The period of time and the temperature for the solid phase polymerization were changed to provide PET-B and PCT-B, which were polyethylene terephthalate having AV and IV shown in Tables 1 and 2 used in Examples and Comparative Examples below. By prolonging the solid phase polymerization time, IV is liable to be increased, and AV is liable to be decreased, and by increasing the solid phase polymerization temperature, AV is liable to be increased, and IV is liable to be decreased.

In the invention, the terminal carboxyl group concentration (AV) of the polyethylene terephthalate and PCT obtained was measured in such a manner that 0.5 g of the polyester was dissolved in o-cresol, which was then measured for the terminal carboxyl group concentration by potentiometric titration using potassium hydroxide.

The intrinsic viscosity (IV) of the polyethylene terephthalate and PCT obtained was measured in such a manner that the polyester was dissolved in o-chlorophenol and measured for the solution viscosity at 25° C., and the intrinsic viscosity was obtained according to the following expression.

$\eta sp/C=[\eta]+K[\eta]^2 \cdot C$ wherein ηsp=(solution viscosity/solvent viscosity)−1, C was the weight of the polymer dissolved per 100 mL of the solvent (which was 1 g per 100 mL in this measurement), and K was the Huggins constant (which was 0.343). The solution viscosity and the solvent viscosity were measured with an Ostwald viscometer.

Reference Example 3

Production of Master Pellets Containing Polyester and Terminal Blocking Agent 90 parts by mass of PET-B, PCT-B and PEN-A obtained by solid phase polymerization in Examples and Comparative Examples and 10 parts by mass of the terminal blocking agent shown in Tables 1 and 2 below selected from the following terminal blocking agents were mixed, and the mixture was fed to a twin-screw extruder, melt-kneaded at 280° C., discharged in the form of strands into water, and cut into chips, which were designated as PET C, PCT C and PEN C (master pellets).

Terminal blocking agent (a): carbodiimide, Stabilizer 9000 (produced by Raschig GmbH), Mw: 20,000
Terminal blocking agent (b): carbodiimide, Stabaxol P (produced by Rhein Chemie Corporation), Mw: 2,600
Terminal blocking agent (c): carbodiimide, N,N'-dicyclohexylcarbodiimide, Mw: 206
Terminal blocking agent (d): carbodiimide, the cyclic carbodiimide compound (2) described in paragraphs [0174] and [0175] of JP-A-2011-153209, Mw: 516
Terminal blocking agent (e): epoxy, the chain extending agent 1 described in paragraph [0115] of JP-A-2010-116560, Mw: 3,300
Terminal blocking agent (f): oxazoline, Epocros RPS-1005 (produced by Nippon Shokubai Co., Ltd.), Mw: 5,000
Terminal blocking agents (g) and (h): polycarbodiimide, polycarbodiimides synthesized according to the following synthesis method having Mw of 70,000 and 100,000, respectively Synthesis Method The terminal blocking agents (g) and (h) were polymerized with 1,3,5-triisopropylphenylene-2,4-isocyanate as a raw material according to J. Org. Chem., 28, 2069-2075 (1963). The molecular weight of the terminal blocking agent was controlled by the polymerization time, and the reaction temperature was decreased to terminate the reaction.

Terminal blocking agent (i): carbodiimide, Stabaxol P100 (produced by Rhein Chemie Corporation), Mw: 10,000
Terminal blocking agent (j): carbodiimide, Stabaxol P400 (produced by Rhein Chemie Corporation), Mw: 20,000
Terminal blocking agent (k): carbodiimide, the cyclic carbodiimide compound (1) described in paragraphs [0171] and [0172] of JP-A-2011-153209, Mw: 252

The molecular weight of the terminal blocking agent was measured by the following manner.

The weight average molecular weight was measured by GPC.

The measurement was performed with tetrahydrofuran as a developing solvent by using the following gel permeation chromatography apparatus.

Apparatus: HLC8120 (produced by Tosoh Corporation)
Column: GMHHR-H+GMHHR-H+G2000HHR Examples 1 to 28, 35 to 41 and 46 to 60 and Comparative Examples 1 to 4

Production of Polyester Film (i) Extrusion
PET-B and PET-C having been controlled in AV and IV were mixed as shown in Tables 1 and 2 below for Examples and Comparative Examples, dried at 180° C. under reduced pressure for 3 hours, and then placed in an extruder under a nitrogen atmosphere. At this time, the mixing ratio of PET-B and PET-C was controlled to provide the terminal blocking agent concentrations shown in Tables 1 and 2. The mixture was discharged from a T-die through a gear pump and a filter, and cast on a casting drum at 25° C. while applying static charge.

Thereafter, the cast resin was solidified by cooling by blowing air at 25° C. at a wind speed of 60 m/min through a slit nozzle, thereby providing an unstretched sheet for a polyester support. In the solidification by cooling, the wind speed of the blowing air was modulated as shown in Tables 1 and 2. The air blow amount (wind speed) was modulated by changing the rotation number of the motor of a blower ejecting air.

(ii) Stretching

The resulting unstretched sheet was preheated to 75° C. with a heating roll, and then subjected to MD stretching 1 of 1.8 times at 80° C. and then MD stretching 2 of 2.3 times at 95° C. Thereafter, both the surfaces thereof were subjected to a corona treatment.

(iii) Formation of Coating Type Conductive Layer

Thereafter, a coating liquid for a conductive layer selected from the following (a) to (d) and (g) (shown in Tables 1 and 2) was coated on one surface of the polyester support with a metaling bar. The thickness was controlled to the values shown in Tables 1 and 2 by changing the size of the metaling bar.

(a) Water Insoluble Cationic Conductive Material

A coating liquid a was prepared by controlling the amount (concentration) of the conductive material to make the surface specific resistance shown in Tables 1 and 2 based on paragraphs [0130] and [0131] of JP-A-2009-158952. Comparative Example 1, Examples 1 to 7, and Comparative Example 2 were performed with the same formulation, Examples 8 to 13 were performed with the same formulation that was different from the former one, Examples 36 to 38 were performed with the same formulation that was different from the former ones, and Examples 47 to 60 were performed with the same formulation that was different from the former ones. In each series of Examples and Comparative Examples, there was a difference in surface specific resistance obtained with the same formulation, and thus the film forming conditions influenced the surface specific resistance.

| Coating Liquid a | |
|---|---|
| Aqueous dispersion of water insoluble cationic conductive material, BONDEIP-PM, a trade name, a major component, produced by Konishi Fat and Oil Co., Ltd., solid content: 30% amount providing surface specific resistance in Tables 1 and 2 | |
| Aqueous dispersion of acrylic resin, obtained by dispersing a copolymer acrylic resin (glass transition temperature: 42° C.) of methyl methacrylate/ethyl acrylate/acrylic acid/N-methylolacrylamide (62/35/2/1) (weight ratio), in the form of particles in water to a solid content of 10% | 3 parts by mass |
| Aqueous dispersion of oxazoline group-containing compound, Epocros, a trade name, RPS-1005 (produced by Nippon Shokubai Co., Ltd., solid content: 40% | 0.75 part by mass |
| Acetylenediol surfactant, Olfine, a trade name, EXP4051F, produced by Nissin Chemical Co., Ltd. | 0.1 part by mass |
| Water | 78.15 parts by mass |

(b) Water Insoluble Polythiophene Conductive Material

A coating liquid b was prepared by controlling the amount (concentration) of the conductive material to make the surface specific resistance shown in Table 1 based on paragraphs [0141] and [0142] of JP-A-2009-158952. As similar to the item (a) above, the series of Comparative Example 3 and Examples 14 to 18 were performed with the same formulation that was different from the former ones.

| Coating Liquid b | |
|---|---|
| Aqueous dispersion of water insoluble polythiophene conductive polymer, Baytron, a trade name, P, produced by Bayer AG and H. C. Starck GmbH, Germany, solid content: 1.2% amount providing surface specific resistance in Tables 1 and 2 | |
| Water insoluble polyester resin, obtained by dispersing a polyester resin (glass transition temperature: 48° C.) formed by copolymerizing terephthalic acid/isophthalic acid/sodium 5-sulfoisophthalic acid (60/30/10) as an acid component and ethylene glycol/diethylene glycol/polyethylene glycol (95/3/2) as a diol component, to a concentration of 10% by weight | 2.5 parts by mass |
| Epoxy crosslinking agent, polyglycerol polyglycidyl ether epoxy crosslinking agent, EX-512 (molecular weight: ca. 630), produced by Nagase ChemteX Corporation | 0.25 part by mass |
| Acetylenediol surfactant, Olfine, a trade name, EXP4051F | 0.1 part by mass |
| Water | 32.1 parts by mass |

(c) Water Soluble Cationic Material

A coating liquid c was prepared by controlling the amount (concentration) of the conductive material to make the surface specific resistance shown in Table 1 based on paragraph [0166] of JP-A-2009-158952. As similar to the item (a) above, the series of Examples 19 to 23 were performed with the same formulation that was different from the former ones.

| Coating Liquid c | |
|---|---|
| Water insoluble cationic material, ammonium polystyrenesulfonate (weight average molecular weight: 65,000 amount providing surface specific resistance in Tables 1 and 2 | |
| Water insoluble acrylic resin, obtained by dispersing a copolymer acrylic resin (glass transition temperature: 42° C.) of methyl methacrylate/ethyl acrylate/acrylic acid/N-methylolacrylamide (62/35/2/1) (weight ratio), in the form of particles in water to a solid content of 10% | 35 parts by mass |
| Aqueous dispersion of oxazoline group-containing compound, Epocros, a trade name, WS-500 (produced by Nippon Shokubai Co., Ltd., solid content: 40% | 4.2 parts by mass |
| Acetylenediol surfactant, Olfine, a trade name, EXP4051F, produced by Nissin Chemical Co., Ltd. | 0.1 part by mass |
| Water | 59.2 parts by mass |

(d) Carbon Nanotube Aqueous Dispersion

A coating liquid d was prepared by controlling the amount (concentration) of the conductive material to make the surface specific resistance shown in Table 1 based on paragraph [0185] of JP-A-2009-158952.

| Coating Liquid d | |
|---|---|
| Carbon nanotube aqueous dispersion, obtained by adding 0.85 weight by mass of two-layer CNT (produced by Science Laboratories Co., Ltd.) and 2 weight by mass of polyvinyl-pyrrolidone in 97.15 weight by mass of pure water, and subjecting the mixture to an ultrasonic treatment with an ultrasonic pluverizer (CX-502, produced by Tokyo Rikakiki Co,. Ltd., output power: 250 W, direct irradiation) for 30 minutes amount providing surface specific resistance in Table 1 | |
| Water insoluble acrylic resin, obtained by dispersing a copolymer acrylic resin (glass transition temperature: 42° C.) of methyl methacrylate/ethyl acrylate/acrylic acid/N-methylolacrylamide (62/35/2/1) (mass ratio), in the form of particles in water to a solid content of 10% | 2.5 parts by mass |
| Water | 92.5 parts by mass |

(g) Water Insoluble Polythiophene Polymer Aqueous Dispersion

A coating liquid g was prepared by controlling the amount (concentration) of the conductive material to make the surface specific resistance shown in Table 1 based on paragraph [0233] of JP-A-2009-158952. As similar to the item (a) above, the series of Examples 24 to 27 were performed with the same formulation that was different from the former ones.

| | |
|---|---|
| Aqueous dispersion of water insoluble polythiophene conductive polymer, Baytron, a trade name, P, produced by Bayer AG and H. C. Starck GmbH, Germany, solid content: 1.2% amount providing surface specific resistance in Tables 1 and 2 | |
| Acetylenediol surfactant, Olfine, a trade name, EXP4051F, produced by Nissin Chemical Co., Ltd. | 0.1 part by mass |
| Water | 16.9 parts by mass |

(iv) Application of Readily Adhesive Layer

A coating liquid for a readily adhesive layer shown in Table 1 was prepared and coated on the surface of the polyester support opposite to the surface having the conductive layer formed, with a metaling bar. The thickness of the readily adhesive layer was controlled to the values shown in Table 1 by changing the size of the metaling bar.

Coating Liquid A-1

The coating liquid for an acrylic readily adhesive layer using the other resin component B-3 described in paragraph [0083] of JP-A-2006-152013 was prepared.

U-1

The urethane adhesive described in paragraph [0055] of JP-A-2006-332091 was prepared.

U-2

The urethane coating liquid (1) described in paragraph [0083] of Japanese Patent No. 4,457,322 was prepared.

U-4

The urethane coating liquid A described in paragraph [0032] of JP-A-2006-175764 was prepared.

E-1

The coating liquid for a polyester readily adhesive layer described in paragraph [0057] of JP-A-2006-253565 was prepared.

E-2

The polyester coating liquid described in paragraph [0087] of Japanese Patent No. 4,547,644 was prepared.

E-3

The polyester coating liquid formed of a polyester polymer adhesive and an isocyanate crosslinking curing agent described in paragraph [0033] of Japanese Patent No. 3,777,725 was prepared.

E-5

The liquid for forming a polyester readily adhesive layer described in paragraph [0090] of Japanese Patent No. 3,731,128 was prepared.

E-6

The polyester coating liquid described in paragraph [0055] of JP-A-2009-269301 was prepared.

V-1

The PVA coating liquid described in paragraph [0045] of JP-A-2009-269301 was prepared.

(v) Stretching and Relaxing Treatments after Application of Conductive Layer and Readily Adhesive Layer Thereafter, the film was preheated and dried at 120° C., stretched in the transverse direction 4.0 times at 115° C., then heat-treated at 170° C. for 10 seconds, and then relaxed in the transverse direction by 4% at 170° C.

(vi) Drying for Application of Temperature Unevenness after Application of Conductive Layer and Readily Adhesive Layer After the stretching and relaxing, the film was dried while applying the temperature unevenness shown in Table 1 thereto, and then cooled. On drying the film, a distribution was applied to the slit width of the nozzle for blowing hot air in the drying zone, thereby applying the temperature unevenness at the outlet port of the drying zone. For the temperature unevenness at the outlet port of the drying zone, non-contact thermometers were provided at the outlet port of the drying zone with an interval of 10 cm in the width direction, and the difference between the maximum temperature and the minimum temperature was measured. The values obtained are shown in Tables 1 and 2.

(vii) Winding

The film having been dried and cooled was slit on both side edges thereof, subjected to a thickening treatment (knurling), and then wound up by 2,000 m with a width of 1 m. The resulting films were designated as the polyester films of Examples and Comparative Examples.

Example 42

The film formation was performed in the same manner as in Examples 1 to 28, 35 to 41 and 46 to 60 having the coating type conductive layer except that the conductive layer was not formed. The corona treatment was applied only to the surface, on which the readily adhesive layer was to be formed.

The following aluminum oxide layer (e) having a thickness of 0.15 μm was applied to the surface of the film on the opposite surface to the readily adhesive layer (i.e., the surface that had no coating thereon).

(e) Aluminum Oxide Layer

The conductive material was controlled in amount (concentration) to make the surface specific resistance shown in Table 1 based on paragraph [0192] of JP-A-2009-158952. Specifically, the resulting film was mounted on an electron beam vapor deposition equipment, and aluminum was vapor-deposited with an electron beam with aluminum having a purity of 99.999% as a vaporization source under conditions of a vacuum degree of $3.4 \times 10^{-5}$ Pa, a vapor deposition rate of 10 Å/sec and a distance between the vapor deposition source to the substrate of 25 cm while introducing 350 sccm of oxygen gas in the normal direction of the film surface, thereby forming a vapor deposition conductive layer formed of aluminum oxide having a thickness of 0.15 μm.

The resulting film was designated as a polyester film of Example 42.

Examples 43 to 45

PET-B and PET-C were mixed and dried under reduced pressure at 180° C. for 3 hours, which was mixed to make the content of the terminal blocking agent shown in Table 2, and the mixture was fed to the main extruder.

In the subsidiary extruder, separately, 85 parts by mass of PET-B having been dried under reduced pressure at 180° C. for 3 hours and 15 parts by mass of a polyetheramide conductive polymer material, Irgastat P18, produced by Ciba Specialty Chemicals Co., Ltd., prepared according to the item (f) below and dried at 100° C. for 6 hours were fed.

The molten resins kneaded in the main extruder and the subsidiary extruder were combined with a two-layer feed block and extruded by molten two-layer lamination coextrusion. The ejection amount of the subsidiary extruder was controlled to make the thickness of the conductive layer shown in Table 2.

Thereafter, the longitudinal stretching, the corona treatment, the coating of a readily adhesive layer, the transverse stretching, the heat treatment, the relaxation, the slitting and the thickening treatment were performed in the same manner as in Examples 1 to 28, 35 to 41 and 46 to 60 after coating the coating type conductive layer, and the film was then wound up by 2,000 m with a width of 1 m. The readily adhesive layer was coated on the opposite surface to the conductive layer, and the corona treatment was applied only to the surface, on which the readily adhesive layer was to be formed.

Example 61 and Comparative Example 9

An example performed for a trace experiment of Example 1-1 of JP-A-2009-158952, in which no terminal blocking agent was added to the polyester support, was designated as Comparative Example 41, and the structure and the production conditions of the polyester film of Comparative Example 9 are shown in Table 2.

A polyester film of Example 61 was produced in the same manner as in Comparative Example 9 except that the terminal blocking agent (j) was added to the polyester support, the air blow amount on solidifying the polyester support by cooling was modulated, and temperature unevenness was applied at the outlet port of the final coating and drying zone after the formation of the conductive layer and the readily adhesive layer.

Takelac/Takenate* shown as the readily adhesive layer for Example 61 and Comparative Example 9 in Table 2 was that described in paragraph [0132] of JP-A-2009-158952.

In Comparative Example 9 and Example 61 shown in Table 2, the vacuum polymerization equipment described in paragraph [0075] in Example 1 of JP-A-2009-158952 was used.

Example 62 and Comparative Example 10

An example obtained by combining and laminating the polyester support containing polycarbodiimide described in Example 1 of JP-A-2010-235824 with the conductive layer and the readily adhesive layer shown in Example 1-1 of JP-A-2009-158952 was designated as Comparative Example 10. The structure and the production conditions of the polyester film of Comparative Example 10 are shown in Table 2.

A polyester film of Example 62 was produced in the same manner as in Comparative Example 10 except that the air blow amount on solidifying the polyester support by cooling was modulated, and temperature unevenness was applied at the outlet port of the final coating and drying zone after the formation of the conductive layer and the readily adhesive layer.

The polycarbodiimide** shown as the kind of the terminal blocking agent for Example 62 and Comparative Example 10 in Table 2 was that described in paragraphs [0077] and [0078] of JP-A-2009-158952. Takelac/Takenate* shown as the readily adhesive layer for Example 62 and Comparative Example 10 in Table 2 was that described in paragraph [0132] of JP-A-2009-158952.

Comparative Examples 5 to 8 and Examples 29 to 34

Polyester films of Comparative Examples 5 to 8 and Examples 29 to 34 were produced in the same manner as in Examples 1 to 28, 35 to 41 and 46 to 60 except that a polyester support was produced by using the PET resin A before adding the terminal blocking agent under the conditions shown in Table 1, and a conductive layer and a readily adhesive layer were produced as shown in Table 1. Comparative Example 7 and 8 and Examples 32 to 34 were controlled for IV and AV by the solid phase polymerization conditions.

Structure Analysis of Polyester Film

The structures of the polyester films of Examples and Comparative Examples thus formed above were analyzed in the following manners. The results are shown in Tables 1 and 2.

Thickness and Thickness Distribution of Conductive Layer

The cross section of the polyester films of Examples and Comparative Examples was obtained by cutting with a microtome and observed with TEM to obtain the thickness of the conductive layer.

Four lines were drawn in each of the vertical direction and the horizontal direction with an interval of 4 cm, and the thickness of the conductive layer was measured for the 16 intersecting points in the aforementioned manner. The thickness distribution of the conductive layer was obtained by dividing the difference between the maximum value and the minimum value by the average value, which was expressed in terms of percentage.

Thickness and Thickness Unevenness of Readily Adhesive Layer

The cross section of the polyester films of Examples and Comparative Examples was obtained by cutting with a microtome and observed with TEM to obtain the thickness of the readily adhesive layer.

The thickness of the readily adhesive layer was measured for 30 points with an interval of 100 μm. The thickness unevenness of the readily adhesive layer was obtained by dividing the difference between the maximum value and the minimum value by the average value, which was expressed in terms of percentage.

Properties of Polyester Film

The properties of the polyester films of Examples and Comparative Examples thus formed were measured in the following measurement methods. The results are shown in Tables 1 and 2.

Surface Specific Resistance R0

The surface specific resistance was measured with Digital Ultra High Resistance-Micro Current Meter R8340, produced by Advantest Corporation. In the case where the surface specific resistance was $10^5 \Omega$ per square or less, Loresta EP, produced by DIA Instruments Co., Ltd., equipped with an ASP probe was used. In the measurement, the surface specific resistance was measured at 10 points arbitrarily selected inside the surface of the polyester films of Examples and Comparative Examples, and the average value thereof was designated as the surface specific resistance R0. The specimen thus measured was allowed to stand in a room at 23° C. and 65% RH overnight, and then subjected to the measurement.

Distribution of Surface Specific Resistance R0

The polyester films of Examples and Comparative Examples were cut into a square of 20×20 cm. Four lines were drawn thereon in each of the vertical direction and the horizontal direction with an interval of 4 cm, and the surface specific resistance was measured for the 16 intersecting points in the aforementioned manner. The in-plane distribution of the surface specific resistance was obtained by dividing the difference between the maximum value and the minimum value by the average value, which was expressed in terms of percentage.

Evaluation of Polyester Film

The polyester films of Examples and Comparative Examples thus formed were evaluated in the following evaluation methods. The results are shown in Tables 1 and 2.

Evaluation of Adhesion Property (Occurrence Rate of Detachment)

The surface of the polyester films on the side of the readily adhesive layer of Examples and Comparative Examples was cut by 10 lines in each of the vertical direction and the horizontal direction with an interval of 5 mm (crosscut cells) with a razor blade.

The film was subjected to a thermostatic treatment at 120° C. and 100% RH for 30 hours.

Thereafter, an adhesive tape (Polyester Adhesive Tape No. 31B, produced by Nitto Denko Corporation) was adhered thereon and the peeled quickly.

The occurrence rate of detachment was obtained by counting the number of cells that underwent detachment, and dividing the number by the total number of cells, which was expressed in terms of percentage.

Evaluation of Withstand Voltage (Improvement Rate of Partial Discharge Voltage)

The partial discharge voltage of the polyester films of Examples and Comparative Examples that had the polyester support, the conductive layer and the readily adhesive layer was divided by the partial discharge voltage of the single layer of the polyester support having no conductive layer, and designated as the improvement rate of a partial discharge voltage.

The partial discharge voltage was obtained with a partial discharge tester, KPD 2050, produced by Kikusui Electronics Corporation. The test conditions were as follows.

The output voltage application pattern in the output sheet selected was the three-step pattern formed of the first step was a pattern of increasing the voltage simply from 0 V to the prescribed test voltage, the second step was a pattern of maintaining the prescribed test voltage, and the third step of decreasing the voltage simply from the prescribed test voltage to 0 V.

The frequency was 50 Hz. The test voltage was 1 kV.

The period of time T1 for the first step was 10 seconds, the period of time T2 for the second step was 2 seconds, and the period of time T3 for the third step was 10 seconds.

The counting method in the pulse count sheet was "+" (plus), and the detection level was 50%.

The charge amount in the range sheet was the range 1,000 pc.

In the protection sheet, the item of voltage was checked, and 2 kV was input. The pulse count was 100,000.

In the measurement mode, the starting voltage was 1.0 pc, and the extinction voltage was 1.0 pc.

In the measurement, the partial discharge voltage was measured at 10 points arbitrarily selected inside the surface of the film in each of the case where the surface A was on the upper electrode and the case where the surface A was on the lower electrode, the average values were each obtained, and the larger value of the average values was designated as the partial discharge voltage V0. The specimen thus measured was allowed to stand in a room at 23° C. and 65% RH overnight, and then subjected to the measurement.

TABLE 1

Production method and structure of film

| | Polyester support | | | | | | Modulation in air blow amount for solidifying by cooling (%) | Conductive layer | | |
|---|---|---|---|---|---|---|---|---|---|---|
| | Terminal blocking agent | | | Polyester (PET) | | | | | | |
| | Kind | Molecular weight | Amount (% by mass) | Solid phase polymerization time (hr) | AV (eq/ton) | IV (dL/g) | | Kind of conductive agent | Thickness (μm) | Thickness distribution (%) |
| Comparative Example 1 | (j) | 20,000 | 0.6 | 15 | 12 | 0.73 | 0 | (a) | 0.5 | 0 |
| Example 1 | (j) | 20,000 | 0.6 | 15 | 12 | 0.73 | 0.1 | (a) | 0.5 | 0.1 |
| Example 2 | (j) | 20,000 | 0.6 | 15 | 12 | 0.73 | 0.3 | (a) | 0.5 | 0.2 |
| Example 3 | (j) | 20,000 | 0.6 | 15 | 12 | 0.73 | 0.6 | (a) | 0.5 | 1 |
| Example 4 | (j) | 20,000 | 0.6 | 15 | 12 | 0.73 | 1 | (a) | 0.5 | 1.6 |
| Example 5 | (j) | 20,000 | 0.6 | 15 | 12 | 0.73 | 2 | (a) | 0.5 | 3 |
| Example 6 | (j) | 20,000 | 0.6 | 15 | 12 | 0.73 | 7 | (a) | 0.5 | 8 |
| Example 7 | (j) | 20,000 | 0.6 | 15 | 12 | 0.73 | 10 | (a) | 0.5 | 10 |
| Comparative Example 2 | (j) | 20,000 | 0.6 | 15 | 12 | 0.73 | 12 | (a) | 0.5 | 11 |

TABLE 1-continued

| | | | | | | | | | | |
|---|---|---|---|---|---|---|---|---|---|---|
| Example 8 | (j) | 20,000 | 1.2 | 20 | 9 | 0.76 | 0.3 | (a) | 0.7 | 0.2 |
| Example 9 | (j) | 20,000 | 1.2 | 20 | 9 | 0.76 | 0.3 | (a) | 0.7 | 1.8 |
| Example 10 | (j) | 20,000 | 1.2 | 20 | 9 | 0.76 | 0.3 | (a) | 0.7 | 2.8 |
| Example 11 | (j) | 20,000 | 1.2 | 20 | 9 | 0.76 | 0.3 | (a) | 0.7 | 3.8 |
| Example 12 | (j) | 20,000 | 1.2 | 20 | 9 | 0.76 | 0.3 | (a) | 0.7 | 5 |
| Example 13 | (j) | 20,000 | 1.2 | 20 | 9 | 0.76 | 0.3 | (a) | 0.7 | 7 |
| Comparative Example 3 | (a) | 20,000 | 0 | 10 | 22 | 0.63 | 5 | (b) | 1 | 0 |
| Example 14 | (a) | 20,000 | 0.1 | 12 | 20 | 0.65 | 5 | (b) | 1 | 0.1 |
| Example 15 | (a) | 20,000 | 0.2 | 16 | 17 | 0.71 | 5 | (b) | 1 | 0.2 |
| Example 16 | (a) | 20,000 | 1 | 24 | 8 | 0.75 | 5 | (b) | 1 | 3.8 |
| Example 17 | (a) | 20,000 | 5 | 40 | 4 | 0.79 | 5 | (b) | 1 | 7.5 |
| Example 18 | (a) | 20,000 | 10 | 60 | 3 | 0.84 | 5 | (b) | 1 | 10 |
| Comparative Example 4 | (a) | 20,000 | 12 | 70 | 1 | 0.92 | 5 | (b) | 1 | 11 |
| Example 19 | (c) | 205 | 2 | 10 | 19 | 0.68 | 1 | (c) | 0.8 | 0.1 |
| Example 20 | (b) | 2,600 | 2 | 10 | 16 | 0.71 | 1 | (c) | 0.8 | 0.2 |
| Example 21 | (a) | 23,000 | 2 | 10 | 10 | 0.74 | 1 | (c) | 0.8 | 2.2 |
| Example 22 | (g) | 70,000 | 2 | 10 | 8 | 0.77 | 1 | (c) | 0.8 | 0.2 |
| Example 23 | (h) | 100,000 | 2 | 10 | 15 | 0.71 | 1 | (c) | 0.8 | 0.1 |
| Example 24 | (b) | 2,600 | 1.5 | 10 | 9 | 0.81 | 2 | (g) | 2 | 2 |
| Example 25 | (d) | 516 | 1.5 | 10 | 10 | 0.79 | 2 | (g) | 2 | 1.8 |
| Example 26 | (k) | 252 | 1.5 | 10 | 10 | 0.79 | 2 | (g) | 2 | 1.8 |
| Example 27 | (e) | 3,300 | 1.5 | 10 | 17 | 0.71 | 2 | (g) | 2 | 0.3 |
| Example 28 | (f) | 5,000 | 1.5 | 10 | 18 | 0.69 | 2 | (g) | 2 | 0.2 |
| Comparative Example 5 | — | — | 0 | 15 | 16 | 0.71 | 0 | (a) | 0.5 | 0 |
| Example 29 | — | — | 0 | 15 | 16 | 0.71 | 0.1 | (a) | 0.5 | 0.1 |
| Example 30 | — | — | 0 | 15 | 16 | 0.71 | 3 | (a) | 0.5 | 1.2 |
| Example 31 | — | — | 0 | 15 | 16 | 0.71 | 10 | (a) | 0.5 | 10 |
| Comparative Example 6 | — | — | 0 | 15 | 16 | 0.71 | 11 | (a) | 0.5 | 11 |
| Comparative Example 7 | — | — | 0 | 9 | 21 | 0.64 | 3 | (a) | 0.5 | |
| Example 32 | — | — | 0 | 10 | 20 | 0.65 | 3 | (a) | 0.5 | |
| Example 33 | — | — | 0 | 15 | 17 | 0.75 | 3 | (a) | 0.5 | |
| Example 34 | — | — | 0 | 70 | 20 | 0.9 | 3 | (a) | 0.5 | |
| Comparative Example 8 | — | — | 0 | 71 | 2 | 0.91 | 3 | (a) | 0.5 | |

| | Readily adhesive layer | | | Temperature distribution at outlet port of coating and drying (° C.) |
|---|---|---|---|---|
| | Kind | Thickness (μm) | Thickness distribution (%) | |
| Comparative Example 1 | E-3 | 1.2 | 0 | 2 |
| Example 1 | E-3 | 1.2 | 0.1 | 2 |
| Example 2 | E-3 | 1.2 | 0.3 | 2 |
| Example 3 | E-3 | 1.2 | 0.8 | 2 |
| Example 4 | E-3 | 1.2 | 1.3 | 2 |
| Example 5 | E-3 | 1.2 | 2 | 2 |
| Example 6 | E-3 | 1.2 | 8 | 2 |
| Example 7 | E-3 | 1.2 | 10 | 2 |
| Comparative Example 2 | E-3 | 1.2 | 12 | 2 |
| Example 8 | E-3 | 0.8 | 0.3 | 0 |
| Example 9 | E-3 | 0.8 | 1 | 0.1 |
| Example 10 | E-3 | 0.8 | 2 | 0.5 |
| Example 11 | E-3 | 0.8 | 4 | 3 |
| Example 12 | E-3 | 0.8 | 7 | 8 |
| Example 13 | E-3 | 0.8 | 9 | 10 |
| Comparative Example 3 | E-5 | 0.7 | 0 | 3 |
| Example 14 | E-5 | 0.7 | 0.1 | 3 |
| Example 15 | E-5 | 0.7 | 0.3 | 3 |
| Example 16 | E-5 | 0.7 | 1.2 | 3 |
| Example 17 | E-5 | 0.7 | 8 | 3 |
| Example 18 | E-5 | 0.7 | 10 | 3 |
| Comparative Example 4 | E-5 | 0.7 | 13 | 3 |
| Example 19 | E-1 | 0.3 | 0.1 | 4 |
| Example 20 | E-1 | 0.3 | 0.3 | 4 |
| Example 21 | E-1 | 0.3 | 1.5 | 4 |
| Example 22 | E-1 | 0.3 | 0.3 | 4 |
| Example 23 | E-1 | 0.3 | 0.15 | 4 |
| Example 24 | E-2 | 2 | 2.5 | 5 |

TABLE 1-continued

| | | | | |
|---|---|---|---|---|
| Example 25 | E-2 | 2 | 2.3 | 5 |
| Example 26 | E-2 | 2 | 2.2 | 5 |
| Example 27 | E-2 | 2 | 0.4 | 5 |
| Example 28 | E-2 | 2 | 0.3 | 5 |
| Comparative Example 5 | E-3 | 1.2 | 0 | 2 |
| Example 29 | E-3 | 1.2 | 0.1 | 2 |
| Example 30 | E-3 | 1.2 | 0.9 | 2 |
| Example 31 | E-3 | 1.2 | 10 | 2 |
| Comparative Example 6 | E-3 | 1.2 | 11 | 2 |
| Comparative Example 7 | E-3 | 1.2 | 0 | 2 |
| Example 32 | E-3 | 1.2 | 0.2 | 2 |
| Example 33 | E-3 | 1.2 | 0.7 | 2 |
| Example 34 | E-3 | 1.2 | 10 | 2 |
| Comparative Example 8 | E-3 | 1.2 | 11 | 2 |

| | Properties of film Surface specific resistance | | | Evaluation of film | | Evaluation of solar cell module | |
|---|---|---|---|---|---|---|---|
| | Average value ($\Omega$ per square) | In-plane distribution (%) | Thickness ($\mu m$) | Adhesion property Occurrence rate of detachment (%) | Improvement rate of withstand voltage (ratio to case with no conductive layer) | Adhesion property Occurrence rate of detachment (per $m^2$) | Improvement rate of withstand voltage (ratio to case with no conductive layer) |
| Comparative Example 1 | $10^{15}$ | 0 | 50 | 25 | 1.2 | 10 | 1.2 |
| Example 1 | $10^{14}$ | 0.1 | 50 | 8 | 1.5 | 5 | 1.5 |
| Example 2 | $10^{13}$ | 0.3 | 50 | 5 | 1.6 | 2 | 1.6 |
| Example 3 | $10^{12}$ | 0.8 | 50 | 2 | 1.7 | 1 | 1.7 |
| Example 4 | $10^{11}$ | 1 | 50 | 0 | 1.8 | 0 | 1.8 |
| Example 5 | $10^{10}$ | 2 | 50 | 0 | 1.8 | 0 | 1.8 |
| Example 6 | $10^{7}$ | 10 | 50 | 4 | 1.7 | 2 | 1.7 |
| Example 7 | $10^{6}$ | 20 | 50 | 7 | 1.5 | 3 | 1.5 |
| Comparative Example 2 | $10^{5}$ | 25 | 50 | 22 | 1.2 | 12 | 1.2 |
| Example 8 | $10^{13}$ | 0.4 | 75 | 7 | 1.5 | 4 | 1.6 |
| Example 9 | $10^{11}$ | 1.5 | 75 | 4 | 1.7 | 2 | 1.7 |
| Example 10 | $10^{10}$ | 2.5 | 75 | 2 | 1.8 | 1 | 1.8 |
| Example 11 | $10^{9}$ | 4 | 75 | 0 | 1.9 | 0 | 1.9 |
| Example 12 | $10^{8}$ | 5 | 75 | 2 | 1.8 | 1 | 1.8 |
| Example 13 | $10^{7}$ | 7 | 75 | 4 | 1.6 | 2 | 1.7 |
| Comparative Example 3 | $10^{15}$ | 0 | 100 | 30 | 1.2 | 12 | 1.2 |
| Example 14 | $10^{14}$ | 0.1 | 100 | 7 | 1.5 | 3 | 1.4 |
| Example 15 | $10^{13}$ | 0.3 | 100 | 4 | 1.6 | 2 | 1.5 |
| Example 16 | $10^{9}$ | 3 | 100 | 0 | 1.7 | 0 | 1.6 |
| Example 17 | $10^{7}$ | 10 | 100 | 5 | 1.6 | 2 | 1.5 |
| Example 18 | $10^{6}$ | 20 | 100 | 8 | 1.5 | 4 | 1.4 |
| Comparative Example 4 | $10^{5}$ | 24 | 100 | 26 | 1.2 | 11 | 1.2 |
| Example 19 | $10^{14}$ | 0.1 | 200 | 18 | 1.4 | 8 | 1.4 |
| Example 20 | $10^{13}$ | 0.3 | 200 | 4 | 1.7 | 2 | 1.7 |
| Example 21 | $10^{9}$ | 1.5 | 200 | 0 | 1.8 | 0 | 1.8 |
| Example 22 | $10^{13}$ | 0.4 | 200 | 5 | 1.7 | 2 | 1.6 |
| Example 23 | $10^{13.5}$ | 0.1 | 200 | 12 | 1.6 | 6 | 1.5 |
| Example 24 | $10^{10}$ | 1.2 | 350 | 0 | 1.8 | 0 | 1.8 |
| Example 25 | $10^{10}$ | 1.1 | 350 | 0 | 1.8 | 0 | 1.8 |
| Example 26 | $10^{10}$ | 1 | 350 | 0 | 1.8 | 0 | 1.8 |
| Example 27 | $10^{13}$ | 0.4 | 350 | 4 | 1.6 | 2 | 1.6 |
| Example 28 | $10^{13.5}$ | 0.3 | 350 | 5 | 1.6 | 3 | 1.6 |
| Comparative Example 5 | $10^{16}$ | 0 | 50 | 35 | 1.1 | 15 | 1.1 |
| Example 29 | $10^{15}$ | 0.1 | 50 | 10 | 1.4 | 7 | 1.4 |
| Example 30 | $10^{13}$ | 0.5 | 50 | 3 | 1.6 | 3 | 1.6 |
| Example 31 | $10^{6}$ | 20 | 50 | 10 | 1.4 | 6 | 1.4 |
| Comparative Example 6 | $10^{5}$ | 28 | 50 | 38 | 1.1 | 13 | 1.1 |
| Comparative Example 7 | $10^{16}$ | 0 | 50 | 35 | 1.1 | 15 | 1.1 |
| Example 32 | $10^{15}$ | 0.1 | 50 | 9 | 1.4 | 8 | 1.4 |
| Example 33 | $10^{13}$ | 0.4 | 50 | 3 | 1.6 | 2 | 1.6 |
| Example 34 | $10^{6}$ | 20 | 50 | 9 | 1.4 | 7 | 1.4 |
| Comparative Example 8 | $10^{5}$ | 28 | 50 | 38 | 1.1 | 13 | 1.1 |

TABLE 2

| | Production method and structure of film | | | | | | | | | |
|---|---|---|---|---|---|---|---|---|---|---|
| | Polyester support | | | | | | Modulation in air blow | Conductive layer | | |
| | Terminal blocking agent | | | Polyester (PET) | | | | | | |
| | Kind | Molecular weight | Amount (% by mass) | Solid phase polymerization time (hr) | AV (eq/ton) | IV (dL/g) | amount for solidifying by cooling (%) | Kind of conductive agent | Thickness (μm) | Thickness distribution (%) |
| Example 35 | (i) | 10,000 | 1 | 25 | 8 | 0.77 | 4 | (a) | 0.01 | 0.2 |
| Example 36 | (i) | 10,000 | 1 | 25 | 8 | 0.77 | 4 | (a) | 0.1 | 0.3 |
| Example 37 | (i) | 10,000 | 1 | 25 | 8 | 0.77 | 4 | (a) | 3 | 2.7 |
| Example 38 | (i) | 10,000 | 1 | 25 | 8 | 0.77 | 4 | (a) | 10 | 3.3 |
| Example 39 | (i) | 10,000 | 1 | 25 | 8 | 0.77 | 4 | (b) | 3 | 3.6 |
| Example 40 | (i) | 10,000 | 1 | 25 | 8 | 0.77 | 4 | (c) | 3 | 2.4 |
| Example 41 | (i) | 10,000 | 1 | 25 | 8 | 0.77 | 4 | (d) | 3 | 1.6 |
| Example 42 | (i) | 10,000 | 1 | 25 | 8 | 0.77 | 4 | (e) | 3 | 1.3 |
| Example 43 | (i) | 10,000 | 1 | 25 | 8 | 0.77 | 4 | (f) | 3 | 1.5 |
| Example 44 | (i) | 10,000 | 1 | 25 | 8 | 0.77 | 4 | (f) | 30 | 1.9 |
| Example 45 | (i) | 10,000 | 1 | 25 | 8 | 0.77 | 4 | (f) | 50 | 2 |
| Example 46 | (i) | 10,000 | 1 | 25 | 8 | 0.77 | 4 | (g) | 3 | 2.3 |
| Example 47 | (d) | 516 | 1.3 | 13 | 15 | 0.72 | 0.5 | (a) | 0.3 | 2.3 |
| Example 48 | (d) | 516 | 1.3 | 13 | 15 | 0.72 | 0.5 | (a) | 0.3 | 2.3 |
| Example 49 | (d) | 516 | 1.3 | 13 | 15 | 0.72 | 0.5 | (a) | 0.3 | 2.3 |
| Example 50 | (d) | 516 | 1.3 | 13 | 15 | 0.72 | 0.5 | (a) | 0.3 | 2.3 |
| Example 51 | (d) | 516 | 1.3 | 13 | 15 | 0.72 | 0.5 | (a) | 0.3 | 2.3 |
| Example 52 | (d) | 516 | 1.3 | 13 | 15 | 0.72 | 0.5 | (a) | 0.3 | 2.3 |
| Example 53 | (d) | 516 | 1.3 | 13 | 15 | 0.72 | 0.5 | (a) | 0.3 | 2.3 |
| Example 54 | (d) | 516 | 1.3 | 13 | 15 | 0.72 | 0.5 | (a) | 0.3 | 2.3 |
| Example 55 | (d) | 516 | 1.3 | 13 | 15 | 0.72 | 0.5 | (a) | 0.3 | 2.3 |
| Example 56 | (d) | 516 | 1.3 | 13 | 15 | 0.72 | 0.5 | (a) | 0.3 | 2.3 |
| Example 57 | (d) | 516 | 1.3 | 13 | 15 | 0.72 | 0.5 | (a) | 0.3 | 2.3 |
| Example 58 | (d) | 516 | 1.3 | 13 | 15 | 0.72 | 0.5 | (a) | 0.3 | 2.3 |
| Example 59 | (d) | 516 | 1.3 | 13 | 15 | 0.72 | 0.5 | (a) | 0.3 | 2.3 |
| Example 60 | (d) | 516 | 1.3 | 13 | 15 | 0.72 | 0.5 | (a) | 0.3 | 2.3 |
| Comparative Example 9 | — | — | 0 | 10*** | 22 | 0.81 | 0 | (a) | 0.15 | 0 |
| Example 61 | (j) | 20,000 | 1.5 | 10*** | 8 | 0.81 | 3 | (a) | 0.15 | 3.3 |
| Comparative Example 10 | ** | 5,300 | 1 | 0 | 19 | 0.85 | 0 | (a) | 0.15 | 0 |
| Example 62 | ** | 5,300 | 1 | 10 | 19 | 0.85 | 3 | (a) | 0.15 | 3.6 |

| | Readily adhesive layer | | | Temperature distribution at outlet port of coating and drying (° C.) |
|---|---|---|---|---|
| | Kind | Thickness (μm) | Thickness distribution (%) | |
| Example 35 | E-6 | 0.5 | 2 | 6 |
| Example 36 | E-6 | 0.5 | 2 | 6 |
| Example 37 | E-6 | 0.5 | 2 | 6 |
| Example 38 | E-6 | 0.5 | 2 | 6 |
| Example 39 | E-6 | 0.5 | 2 | 6 |
| Example 40 | E-6 | 0.5 | 2 | 6 |
| Example 41 | E-6 | 0.5 | 2 | 6 |
| Example 42 | E-6 | 0.5 | 2 | 6 |
| Example 43 | E-6 | 0.5 | 2 | 6 |
| Example 44 | E-6 | 0.5 | 2 | 6 |
| Example 45 | E-6 | 0.5 | 2 | 6 |
| Example 46 | E-6 | 0.5 | 2 | 6 |
| Example 47 | A-1 | 0.7 | 0.4 | 1 |
| Example 48 | U-1 | 0.7 | 0.4 | 1 |
| Example 49 | U-2 | 0.7 | 0.4 | 1 |
| Example 50 | U-4 | 0.7 | 0.4 | 1 |
| Example 51 | E-1 | 0.7 | 0.6 | 1 |
| Example 52 | E-2 | 0.7 | 0.7 | 1 |
| Example 53 | E-3 | 0.01 | 0.2 | 1 |
| Example 54 | E-3 | 0.03 | 0.3 | 1 |
| Example 55 | E-3 | 0.7 | 0.8 | 1 |
| Example 56 | E-3 | 5 | 1.2 | 1 |
| Example 57 | E-3 | 10 | 1.2 | 1 |
| Example 58 | E-5 | 0.7 | 0.8 | 1 |
| Example 59 | E-6 | 0.7 | 0.6 | 1 |
| Example 60 | V-1 | 0.7 | 0.4 | 1 |
| Comparative Example 9 | * | 0.85 | 0 | 0 |
| Example 61 | * | 0.85 | 3 | 3 |

TABLE 2-continued

| | | | | Comparative Example 10 | * | 0.85 | 0 | 0 |
| | | | | Example 62 | * | 0.85 | 3 | 3 |

| | Properties of film | | | Evaluation of film | | Evaluation of solar cell module | |
|---|---|---|---|---|---|---|---|
| | Surface specific resistance | | | Adhesion property | Improvement rate of withstand | Adhesion property Occurrence | Improvement rate of withstand |
| | Average value (Ω per square) | In-plane distribution (%) | Thickness (μm) | Occurrence rate of detachment (%) | voltage (ratio to case with no conductive layer) | rate of detachment (per m²) | voltage (ratio to case with no conductive layer) |
| Example 35 | $10^7$ | 0.2 | 150 | 0 | 1.5 | 0 | 1.5 |
| Example 36 | $10^8$ | 0.4 | 150 | 0 | 1.6 | 0 | 1.6 |
| Example 37 | $10^{10}$ | 2 | 150 | 0 | 1.7 | 0 | 1.7 |
| Example 38 | $10^{10}$ | 2.2 | 150 | 0 | 1.7 | 0 | 1.7 |
| Example 39 | $10^{10}$ | 2.5 | 150 | 0 | 1.7 | 0 | 1.7 |
| Example 40 | $10^9$ | 1.8 | 150 | 0 | 1.6 | 0 | 1.6 |
| Example 41 | $10^8$ | 1.1 | 150 | 0 | 1.5 | 0 | 1.5 |
| Example 42 | $10^8$ | 1 | 150 | 0 | 1.5 | 0 | 1.5 |
| Example 43 | $10^8$ | 1.1 | 150 | 0 | 1.5 | 0 | 1.5 |
| Example 44 | $10^9$ | 1.5 | 150 | 0 | 1.6 | 0 | 1.5 |
| Example 45 | $10^9$ | 1.5 | 150 | 0 | 1.6 | 0 | 1.6 |
| Example 46 | $10^9$ | 1.7 | 150 | 0 | 1.6 | 0 | 1.6 |
| Example 47 | $10^{10}$ | 1.8 | 75 | 6 | 1.7 | 3 | 1.7 |
| Example 48 | $10^{10}$ | 1.8 | 75 | 5 | 1.7 | 3 | 1.6 |
| Example 49 | $10^{10}$ | 1.8 | 75 | 6 | 1.7 | 3 | 1.7 |
| Example 50 | $10^{10}$ | 1.8 | 75 | 5 | 1.7 | 2 | 1.7 |
| Example 51 | $10^{10}$ | 1.8 | 75 | 2 | 1.7 | 1 | 1.6 |
| Example 52 | $10^{10}$ | 1.8 | 75 | 2 | 1.7 | 1 | 1.7 |
| Example 53 | $10^{10}$ | 1.8 | 75 | 6 | 1.7 | 3 | 1.7 |
| Example 54 | $10^{10}$ | 1.8 | 75 | 3 | 1.7 | 1 | 1.6 |
| Example 55 | $10^{10}$ | 1.8 | 75 | 0 | 1.7 | 0 | 1.7 |
| Example 56 | $10^{10}$ | 1.8 | 75 | 0 | 1.7 | 0 | 1.7 |
| Example 57 | $10^{10}$ | 1.8 | 75 | 0 | 1.7 | 0 | 1.6 |
| Example 58 | $10^{10}$ | 1.8 | 75 | 0 | 1.7 | 0 | 1.7 |
| Example 59 | $10^{10}$ | 1.8 | 75 | 2 | 1.7 | 1 | 1.6 |
| Example 60 | $10^{10}$ | 1.8 | 75 | 6 | 1.7 | 3 | 1.7 |
| Comparative Example 9 | $6 \times 10^9$ | 0 | 50 | 35 | 1.2 | 18 | 1.2 |
| Example 61 | $10^{10}$ | 2.5 | 50 | 0 | 1.7 | 3 | 1.8 |
| Comparative Example 10 | $6 \times 10^9$ | 0 | 50 | 30 | 1.2 | 15 | 1.2 |
| Example 62 | $10^{10}$ | 2.5 | 50 | 0 | 1.7 | 0 | 1.7 | note:
*Takelac/Takenate,
**polycarbodiimide

It was understood from Tables 1 and 2 that the polyester films of the invention had an improvement rate in withstand voltage that was largely increased as compared to the polyester films of Comparative Examples. It was also understood that in Example 24, a good capability was obtained irrespective of the small molecular weight of the terminal blocking agent. It is considered that this is because of the cyclic structure.

The polyester film of Comparative Example 1 having a surface specific resistance of the conductive layer that was lower than the lower limit of the invention had a low improvement rate in withstand voltage. The polyester film of Comparative Example 2 having a surface specific resistance of the conductive layer that exceeded the upper limit of the invention had a low improvement rate in withstand voltage. The polyester film of Comparative Example 3 containing no terminal blocking agent added and having a surface specific resistance of the conductive layer that was lower than the lower limit of the invention had a low improvement rate in withstand voltage. The polyester film of Comparative Example 4 containing a large amount of the terminal blocking agent added and having a surface specific resistance of the conductive layer that exceeded the upper limit of the invention had a low improvement rate in withstand voltage. The polyester film of Comparative Example 5 as a trace experiment of Example 1-1 of JP-A-2009-158952 had a low improvement rate in withstand voltage. The polyester film of Comparative Example 6 obtained by combining and laminating the polyester support containing carbodiimide described in Example 1 of JP-A-2010-235824 with the conductive layer and the readily adhesive layer described in Example 1-1 of JP-A-2009-158952 had a low improvement rate in withstand voltage.

The polyester films of the invention had good adhesion property of the easily conductive layer, and the polyester films of Comparative Examples had poor adhesion property of the easily conductive layer.

It was understood from the comparison between Examples 30 and 33 and Examples having the terminal blocking agent added that the adhesion property in the evaluation of the film and the solar cell module was improved by the addition of the terminal blocking agent. While not sticking to any theory, it is expected that the terminal blocking agent reduces the crystallinity of PET to provide a soft surface thereof, which enhances the adhesion property, and the soft surface layer functions as a cushioning layer, which disperses the detachment stress. The same effect was obtained for PCT. PCT is difficult to have such a firm crystalline structure equivalent to PET and thus is liable to have decreased adhesion property. It is expected that in the case where PCT and the terminal blocking agent are used, the reduction of adhesion failure prevents cracking from being formed in the charged layer near the site suffering the adhesion failure, and thus the withstand voltage is improved thereby to enhance the improvement rate in withstand voltage.

Examples 101 to 162

Production and Evaluation of Solar Cell Module

Solar cell modules were produced by using the polyester films of Examples 1 to 62, which contained a polyester support having on one surface thereof a readily adhesive layer and on the other surface thereof a conductive layer, as a back sheet for a solar cell module.

Toughened glass having a thickness of 3 mm, an EVA sheet (SC50B, produced by Mitsui Chemicals Fabro, Inc.), a crystalline type solar cell, an EVA sheet (SC50B, produced by Mitsui Chemicals Fabro, Inc.) and the back sheet for a solar cell module were laminated in this order, and hot-pressed with a vacuum laminator (vacuum laminator, produced by Nisshinbo Co., Ltd.) to adhere to the EVA sheet. At this time, the readily adhesive layer 2 of the back sheet for a solar cell module was disposed to be in contact with the EVA sheet. The adhesion was performed in the following manner.

Adhesion Method

By using a vacuum laminator, the assembly was provisionally adhered by vacuuming at 128° C. for 3 minutes and pressing for 2 minutes. Thereafter, the assembly was adhered in a dry oven at 150° C. for 30 minutes.

The solar cell modules 101 to 162 were subjected to electric power generation, and thus exhibited good electric power generation capability as a solar cell. In the evaluation, the solar cell module was subjected to a thermostatic treatment at 85° C. and 85% RH for 3,000 hours, and then the number of sites suffering adhesion failure occurring in the back sheet was counted and converted to a number per unit area (m$^2$). The results are shown in Tables 1 and 2.

The improvement rate in withstand voltage was also measured after installing in the solar cell module, and the solar cell module exhibited good capability as similar to the film. The results are shown in Tables 1 and 2.

Examples 201 to 215 and Comparative Example 201

PCT Film

In the PCT resin (PCT-A) polymerized above, one containing CHDM in an amount of 20% by mol or less (low CHDM) and PET (CHDM in an amount of 0% by mol) were subjected to the solid phase polymerization in the aforementioned manner (PCT-B).

One containing CHDM in an amount of 80% by mol or more (high CHDM) was not subjected to solid phase polymerization and was used as it is (PCT-A).

The resins were formed into a film according to the aforementioned method. The resin with high CHDM was formed into a laminated structure with a feed block die (see Table 3 below). In the laminated structure, PET was used as an inner layer, on both surfaces of which PCT having the CHDM content shown in Table 3 were laminated. The films having the laminated structure were measured for AV and IV according the aforementioned method after dissolving all the layers.

Thereafter, the conductive layer and the readily adhesive layer were laminated thereon in the same manner as in Example 1, thereby producing polyester films of Examples and Comparative Example. Thereafter, solar cell modules of Examples and Comparative Example were produced in the same manner as in Example 101.

The results obtained by evaluating in the same manner as in Example 1 are shown in Table 3.

It was understood that while no terminal blocking agent was used in this level, Examples 201 to 209 using PCT that satisfied the condition (B) provided the surface specific resistance distribution and the thickness distribution equivalent to Examples 201 to 209 using the terminal blocking agent, and thus exhibited good characteristics.

It was understood that in the high CHDM range, the lamination (Examples 207 to 209) exhibited good capability as compared to the single layer (Example 205).

It was understood that in the systems where PCT and the terminal blocking agent were used in combination (Examples 210 to 215, which satisfied both the conditions (A) and (B)), the surface specific resistance distribution and the thickness distribution was liable to be imparted, and the adhesion property and the improvement rate in withstand voltage were enhanced, as compared to those in the system not using the terminal blocking agent (Examples 201 to 206, which satisfied only the condition (B)).

It was understood that the polyester film of Comparative Example 201, which did not satisfy both the conditions (A) and (B), was poor in adhesion property and had a low improvement rate in withstand voltage.

Examples 216 and 217

PEN Film

PEN-A prepared above and PEN-C containing the terminal blocking agent to satisfy the condition (A) were formed into a film.

Thereafter, the conductive layer and the readily adhesive layer were laminated in the same manner as in Example 1, thereby producing polyester films of Examples 216 and 217. Thereafter, solar cell modules of Examples 216 and 217 were produced in the same manner as in Example 101.

The results obtained by evaluating in the same manner as in Example 1 are shown in Table 3. It was understood that the films of Examples 216 and 217 exhibited good adhesion property and good improvement rate in withstand voltage.

TABLE 3

| | Production method and structure of film Polyester support ||||||||||| Modulation in air blow amount for solidifying by cooling (%) |
|---|---|---|---|---|---|---|---|---|---|---|---|
| | Composition of outermost layer |||||||| Lamination || |
| | Terminal blocking agent ||| Polyester ||||| structure Layer structure | Thickness ratio | |
| | Kind | Molecular weight | Amount (% by mass) | Kind | CHDM content in PCT (% by mol) | Solid phase polymerization time (hr) | AV (eq/ton) | VI (dL/g) | | | |
| Comparative Example 201 | — | — | 0 | PCT | 0 | 20 | 12 | 0.73 | single layer | — | 0.5 |
| Example 201 | — | — | 0 | PCT | 0.1 | 20 | 10 | 0.76 | single layer | — | 0.5 |
| Example 202 | — | — | 0 | PCT | 10 | 20 | 8 | 0.8 | single layer | — | 0.5 |
| Example 203 | — | — | 0 | PCT | 20 | 20 | 8 | 0.82 | single layer | — | 0.5 |
| Example 204 | — | — | 0 | PCT | 80 | 20 | 8 | 0.84 | single layer | — | 0.5 |
| Example 205 | — | — | 0 | PCT | 90 | 20 | 9 | 0.84 | single layer | — | 0.5 |
| Example 206 | — | — | 0 | PCT | 100 | 20 | 8 | 0.85 | single layer | — | 0.5 |
| Example 207 | — | — | 0 | PCT | 90 | 20 | 12 | 0.74 | PCT/PET/PCT | 10/80/10 | 0.5 |
| Example 208 | — | — | 0 | PCT | 90 | 20 | 11 | 0.76 | PCT/PET/PCT | 15/70/15 | 0.5 |
| Example 209 | — | — | 0 | PCT | 90 | 20 | 10 | 0.78 | PCT/PET/PCT | 25/50/25 | 0.5 |
| Example 210 | (a) | 20,000 | 1 | PCT | 0.1 | 20 | 7 | 0.78 | single layer | — | 0.5 |
| Example 211 | (d) | 516 | 1 | PCT | 10 | 20 | 6 | 0.82 | single layer | — | 0.5 |
| Example 212 | (k) | 252 | 1 | PCT | 20 | 20 | 5 | 0.84 | single layer | — | 0.5 |
| Example 213 | (a) | 20,000 | 0.5 | PCT | 80 | 20 | 5 | 0.86 | single layer | — | 0.5 |
| Example 214 | (d) | 516 | 0.5 | PCT | 90 | 20 | 5 | 0.87 | single layer | — | 0.5 |
| Example 215 | (k) | 252 | 0.5 | PCT | 100 | 20 | 5 | 0.87 | single layer | — | 0.5 |
| Example 216 | — | — | 0 | PEN | — | none | 12 | 0.65 | single layer | — | 0.5 |
| Example 217 | (d) | 516 | 1 | PEN | — | none | 5 | 0.69 | single layer | — | 0.5 |

| | Production method and structure of film |||||| Temperature distribution at outlet port of coating and drying (° C.) |
|---|---|---|---|---|---|---|---|
| | Conductive layer ||| Readily adhesive layer ||| |
| | Kind | Thickness (μm) | Thickness distribution (%) | Kind | Thickness (μm) | Thickness distribution (%) | |
| Comparative Example 201 | (a) | 0.5 | 0 | E-3 | 1.2 | 0 | 1 |
| Example 201 | (a) | 0.5 | 0.2 | E-3 | 1.2 | 0.2 | 1 |
| Example 202 | (a) | 0.5 | 0.7 | E-3 | 1.2 | 2 | 1 |
| Example 203 | (a) | 0.5 | 0.3 | E-3 | 1.2 | 0.3 | 1 |
| Example 204 | (a) | 0.5 | 0.3 | E-3 | 1.2 | 0.4 | 1 |
| Example 205 | (a) | 0.5 | 0.3 | E-3 | 1.2 | 0.4 | 1 |
| Example 206 | (a) | 0.5 | 0.3 | E-3 | 1.2 | 0.4 | 1 |
| Example 207 | (a) | 0.5 | 0.1 | E-3 | 1.2 | 0.6 | 1 |
| Example 208 | (a) | 0.5 | 0 | E-3 | 1.2 | 1.5 | 1 |
| Example 209 | (a) | 0.5 | 0.1 | E-3 | 1.2 | 0.8 | 1 |
| Example 210 | (b) | 0.5 | 0.3 | E-5 | 1.2 | 0.3 | 1 |
| Example 211 | (b) | 0.5 | 0.8 | E-6 | 2.2 | 2.5 | 2 |
| Example 212 | (b) | 0.5 | 0.5 | E-7 | 3.2 | 0.5 | 3 |
| Example 213 | (b) | 0.5 | 0.5 | E-8 | 4.2 | 0.6 | 4 |
| Example 214 | (b) | 0.5 | 0.5 | E-9 | 5.2 | 0.6 | 5 |
| Example 215 | (b) | 0.5 | 0.5 | E-5 | 1.2 | 0.6 | 1 |
| Example 216 | (c) | 0.5 | 0.2 | E-5 | 0.5 | 0.3 | 1 |
| Example 217 | (c) | 0.5 | 0.6 | E-5 | 0.5 | 0.3 | 1 |

| | Property of film Surface specific resistance || | Evaluation of film || Evaluation of solar cell module ||
|---|---|---|---|---|---|---|---|
| | Average value (Ω per square) | In-plane distribution (%) | Thickness (μm) | Adhesion property Occurrence rate of detachment (per m²) | Improvement rate of withstand voltage (ratio to case with no conductive layer) | Adhesion property Occurrence rate of detachment (per m²) | Improvement rate of withstand voltage (ratio to case with no conductive layer) |
| Comparative Example 201 | $10^{15}$ | 0 | 75 | 22 | 1.2 | 11 | 1.2 |
| Example 201 | $10^{14}$ | 0.3 | 75 | 8 | 1.5 | 5 | 1.5 |
| Example 202 | $10^{11}$ | 1.5 | 75 | 0 | 1.8 | 0 | 1.8 |
| Example 203 | $10^{13}$ | 0.4 | 75 | 7 | 1.6 | 4 | 1.5 |
| Example 204 | $10^{13}$ | 0.7 | 75 | 3 | 1.6 | 2 | 1.6 |
| Example 205 | $10^{13}$ | 0.7 | 75 | 4 | 1.6 | 2 | 1.6 |

TABLE 3-continued

| | | | | | | | |
|---|---|---|---|---|---|---|---|
| Example 206 | $10^{13}$ | 0.8 | 75 | 4 | 1.6 | 2 | 1.6 |
| Example 207 | $10^{11}$ | 1.3 | 75 | 2 | 1.7 | 1 | 1.7 |
| Example 208 | $10^{10}$ | 2 | 75 | 0 | 1.8 | 0 | 1.8 |
| Example 209 | $10^{11}$ | 1.5 | 75 | 2 | 1.7 | 1 | 1.7 |
| Example 210 | $10^{14}$ | 0.5 | 75 | 6 | 1.6 | 3 | 1.6 |
| Example 211 | $10^{10}$ | 1.8 | 75 | 0 | 1.9 | 0 | 1.9 |
| Example 212 | $10^{12}$ | 0.6 | 75 | 5 | 1.7 | 2 | 1.7 |
| Example 213 | $10^{12}$ | 0.7 | 75 | 2 | 1.7 | 1 | 1.7 |
| Example 214 | $10^{12}$ | 0.8 | 75 | 2 | 1.7 | 1 | 1.7 |
| Example 215 | $10^{12}$ | 0.8 | 75 | 3 | 1.7 | 2 | 1.7 |
| Example 216 | $10^{12}$ | 0.6 | 100 | 5 | 1.8 | 2 | 1.7 |
| Example 217 | $10^{11}$ | 0.9 | 100 | 1 | 1.9 | 0 | 1.8 |

While the present invention has been described in detail and with reference to specific embodiments thereof, it will be apparent to one skilled in the art that various changes and modifications can be made therein without departing from the spirit and scope thereof.

The present disclosure relates to the subject matter contained in International Application No. PCT/JP2013/056737, filed Mar. 12, 2013; Japanese Application No. 2012-070106, filed Mar. 26, 2012; and Japanese Application No. 2012-141288, filed Jun. 22, 2012, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

REFERENCE SIGN LIST 2 readily adhesive layer
3 conductive layer
12 back sheet for solar cell module
16 polyester support
22 sealant
20 solar cell device
24 transparent front substrate (toughened glass)
10 solar cell module

What is claimed is:

1. A polyester film comprising a polyester support that has a terminal carboxylic acid value, AV of from 3 to 20 eq/ton and IV of from 0.65 to 0.9 dL/g, and a conductive layer that is provided at least one surface of the polyester support,
the conductive layer having a surface specific resistance R0 of from $10^6$ to $10^{14}\Omega$ per square, and
the surface specific resistance R0 of the conductive layer having an in-plane distribution of from 1% to 20%,
wherein the conductive layer has a thickness distribution of from 0.1 to 10%.

2. The polyester film according to claim 1, wherein the polyester support contains at least one layer of a polyester layer that contains as a major component a polyester component that satisfies at least one of the following conditions (A) and (B):

condition (A): the polyester component is a polyester composition that contains a polyester and an terminal blocking agent in an amount of from 0.1 to 10% by mass based on the polyester, and condition (B): the polyester component is a CHDM polyester that contains a structure derived from 1,4-cyclohexanedimethanol, CHDM in an amount of from 0.1 to 20% by mol or from 80 to 100% by mol based on a diol component.

3. The polyester film according to claim 2, which has, as the outermost layer of the polyester support on the side where the conductive layer is provided, a polyester layer that contains as a major component a polyester component that satisfies at least one of the conditions (A) and (B).

4. The polyester film according to claim 2, wherein the polyester component satisfies the condition (A).

5. The polyester film according to claim 4, wherein the terminal blocking agent has a weight average molecular weight of from 200 to 100,000.

6. The polyester film according to claim 4, wherein the terminal blocking agent is a carbodiimide compound.

7. The polyester film according to claim 4, wherein the terminal blocking agent is a carbodiimide compound having a carbodiimide group, and having a cyclic structure in which two nitrogen atoms in the carbodiimide group are bonded via a linking group.

8. The polyester film according to claim 2, wherein the terminal blocking agent is a cyclic carbodiimide compound.

9. The polyester film according to claim 1, wherein the conductive layer contains an organic conductive agent.

10. The polyester film according to claim 1, wherein the conductive layer has a thickness of from 0.01 to 50 µm.

11. The polyester film according to claim 1, which comprises a readily adhesive layer having a thickness unevenness of from 0.1 to 10% on at least one surface of the polyester support.

12. The polyester film according to claim 1, wherein the polyester support is formed by extruding a molten material of a composition containing a polyester and a terminal blocking agent from a die, and then solidifying the composition by cooling with air blow having an air blow amount with a modulation of from 0.1 to 10%.

13. The polyester film according to claim 1, wherein the conductive layer is formed by coating a coating liquid for a conductive layer, and then drying the coating liquid at an outlet port of a drying zone by applying a temperature distribution of from 0.1 to 10° C.

14. The polyester film according to claim 1, which is wound up into a roll form.

15. A back sheet for a solar cell module, comprising a polyester film comprising a polyester support that has a terminal carboxylic acid value, AV of from 3 to 20 eq/ton and IV of from 0.65 to 0.9 dL/g, and a conductive layer that is provided at least one surface of the polyester support, the conductive layer having a surface specific resistance R0 of from $10^6$ to $10^{14}\Omega$ per square, and the surface specific resistance R0 of the conductive layer having an in-plane distribution of from 1% to 20%, wherein the conductive layer has a thickness distribution of from 0.1 to 10%.

16. A solar cell module comprising the back sheet for a solar cell module, which comprises a polyester film comprising a polyester support that has a terminal carboxylic acid value, AV of from 3 to 20 eq/ton and IV of from 0.65 to 0.9 dL/g, and a conductive layer that is provided at least one surface of the polyester support, the conductive layer having a surface specific resistance R0 of from $10^6$ to $10^{14}\Omega$ per square, and the surface specific resistance R0 of the conductive layer having an in-plane distribution of from 1% to 20%, wherein the conductive layer has a thickness distribution of from 0.1 to 10%.

17. A method for producing a polyester film comprising:

extruding a molten material of a polyester composition from a die and solidifying the composition by cooling, so as to produce a polyester support that has a terminal carboxylic acid value, AV of from 3 to 20 eq/ton and IV of from 0.65 to 0.9 dL/g; and forming a conductive layer on at least one surface of the polyester support, the conductive layer having a surface specific resistance R0 of from $10^6$ to $10^{14}\Omega$ per square, the surface specific resistance R0 of the conductive layer having an in-plane distribution of from 1% to 20%, and the polyester support being cooled with air blow having an air blow amount with a modulation of from 0.5% to 10%, wherein the conductive layer has a thickness distribution of from 0.1 to 10%.

18. The method for producing a polyester film according to claim 17, wherein the polyester composition is a composition that contains as a major component a polyester component that satisfies at least one of the following conditions (A) and (B):

condition (A): the polyester component is a polyester composition that contains a polyester and a terminal blocking agent in an amount of from 0.1 to 10% by mass based on the polyester, and condition (B): the polyester component is a CHDM polyester that contains a structure derived from 1,4-cyclohexanedimethanol, CHDM in an amount of from 0.1 to 20% by mol or from 80 to 100% by mol of a diol component.

19. The method for producing a polyester film according to claim 18, wherein the polyester component satisfies the condition (A).

20. The method for producing a polyester film according to claim 17, which comprises:

coating a coating liquid for a conductive layer on at least one surface of the polyester support; and conveying the polyester support having the coating liquid for a conductive layer coated thereon, in a drying zone, so as to form the conductive layer, and a temperature distribution of from 0.1 to 10° C. is applied at an outlet port of the drying zone.

* * * * *